(12) United States Patent
Mii et al.

(10) Patent No.: US 7,808,116 B2
(45) Date of Patent: Oct. 5, 2010

(54) SEMICONDUCTOR DEVICE AND WIRE BONDING METHOD

(75) Inventors: Tatsunari Mii, Tachikawa (JP); Toshihiko Toyama, Tokorozawa (JP); Horoaki Yoshino, Akishima (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 163 days.

(21) Appl. No.: 12/070,000

(22) Filed: Feb. 14, 2008

(65) Prior Publication Data

US 2008/0197510 A1 Aug. 21, 2008

(30) Foreign Application Priority Data

Feb. 21, 2007 (JP) ............................. 2007-040205
May 23, 2007 (JP) ............................. 2007-136106

(51) Int. Cl.
*H01L 23/48* (2006.01)
(52) U.S. Cl. ................... 257/784; 257/786; 257/773; 257/776; 257/E23.024; 438/617; 228/116; 228/180.5
(58) Field of Classification Search ................ 257/784, 257/786, 773, 776, E23.024; 438/617; 228/116; 228/180.5
See application file for complete search history.

(56) References Cited

U.S. PATENT DOCUMENTS 6,206,273 B1 * 3/2001 Beaman et al. .......... 228/180.5

FOREIGN PATENT DOCUMENTS

| JP | 2723277 | 8/1990 |
| JP | 2969953 | 6/1993 |
| JP | 3570551 | 9/2002 |
| JP | 2004-247672 | 9/2004 |

* cited by examiner

*Primary Examiner*—Tu-Tu V Ho
(74) *Attorney, Agent, or Firm*—H. Henry Koda; William L. Androlia

(57) ABSTRACT

A semiconductor device with improved bondability between a wire and a bump and cutting property of the wire to improve the bonding quality. In the semiconductor device, a wire is stacked on a pad as a second bonding point to form a bump having a sloped wedge and a first bent wire convex portion, and a wire is looped from a lead as a first bonding point to the bump and is pressed to the sloped wedge of the bump with a face portion of a tip end of a capillary to bond the wire to the bump. At the same time, the wire is pressed to the first bent wire convex portion using an inner chamfer of a bonding wire hole in the capillary to form a wire bent portion having a bow-shaped cross section. The wire is pulled up and cut at the wire bent portion.

15 Claims, 20 Drawing Sheets

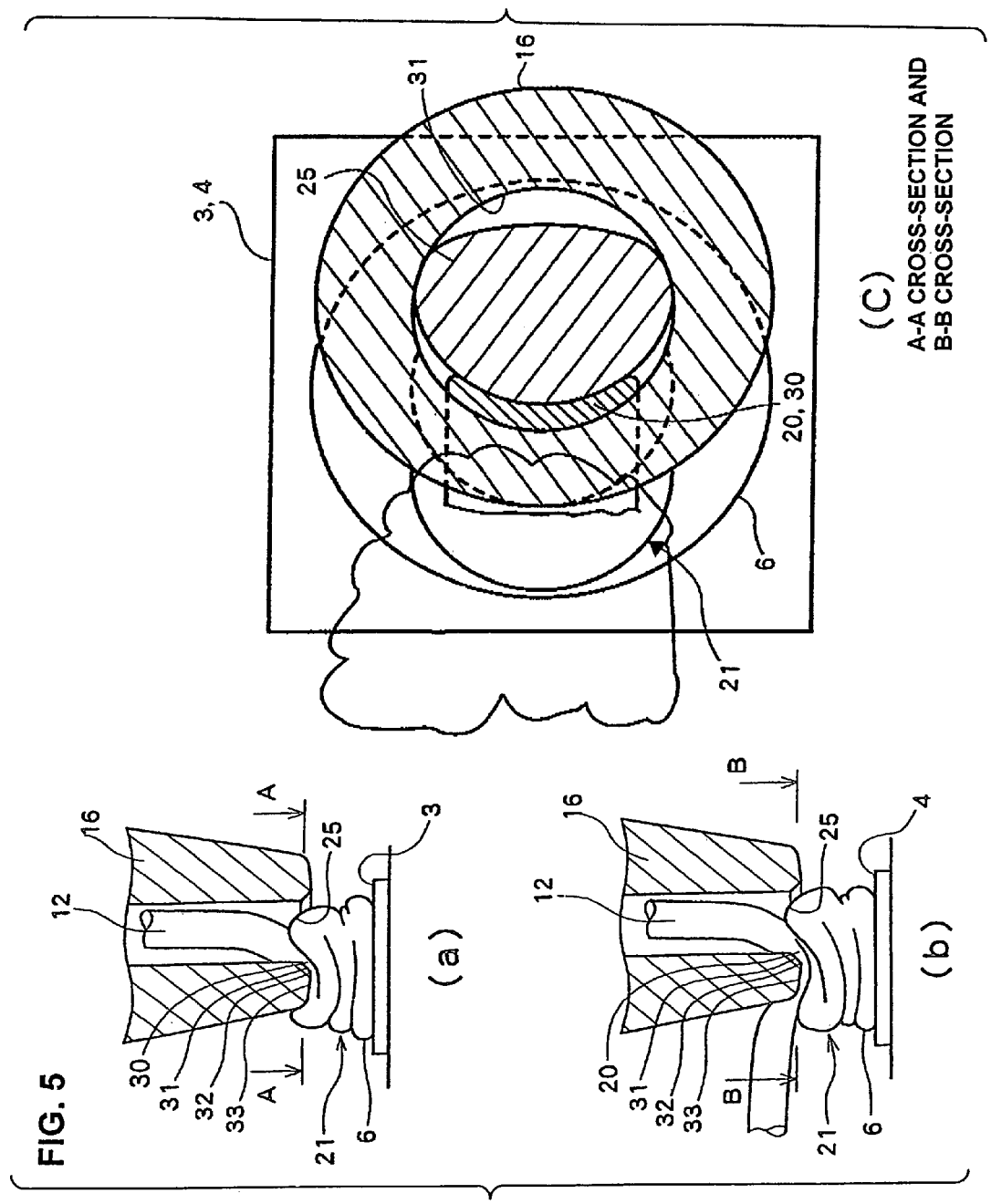

FIG. 12A
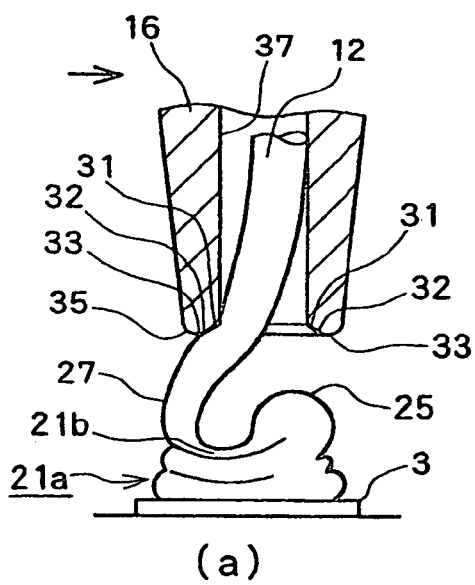
(a)
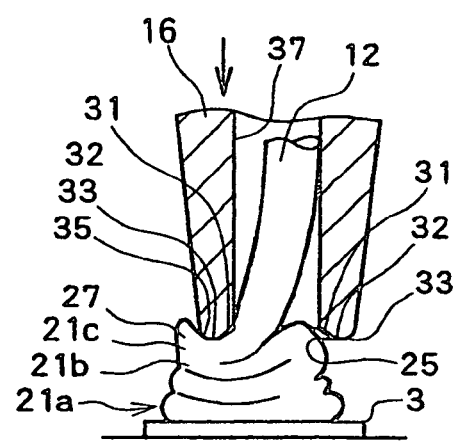
(b)
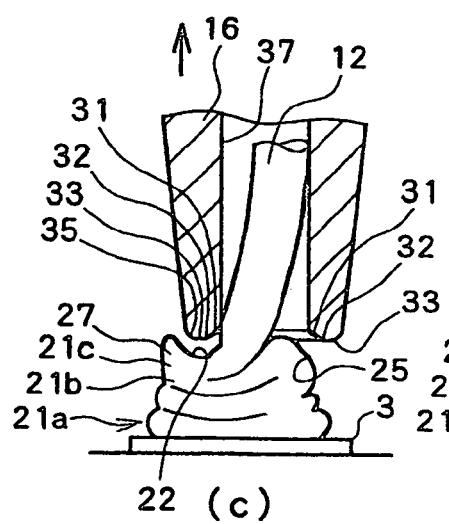
(c)
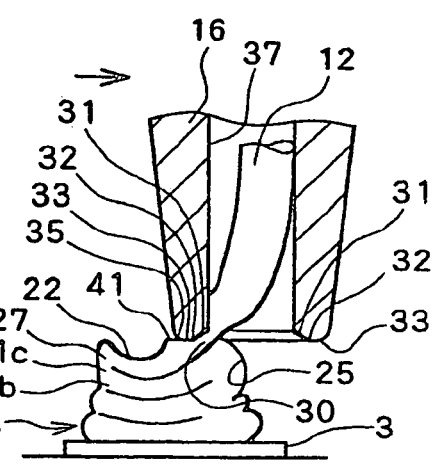
(d)

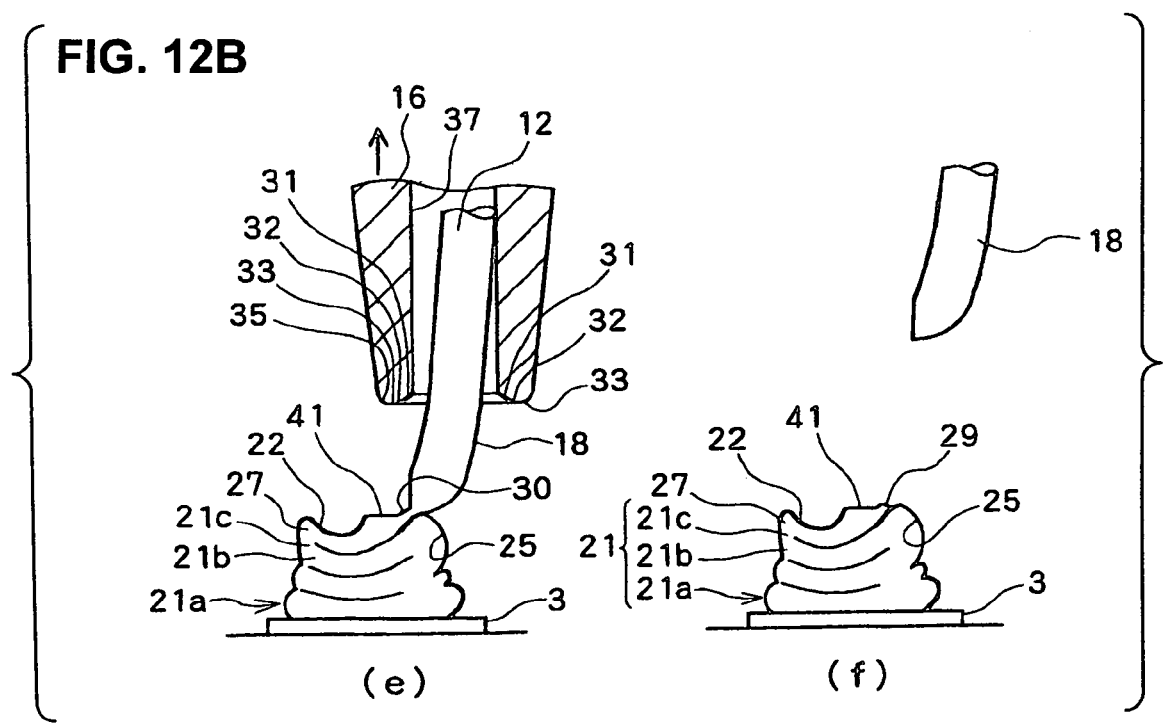

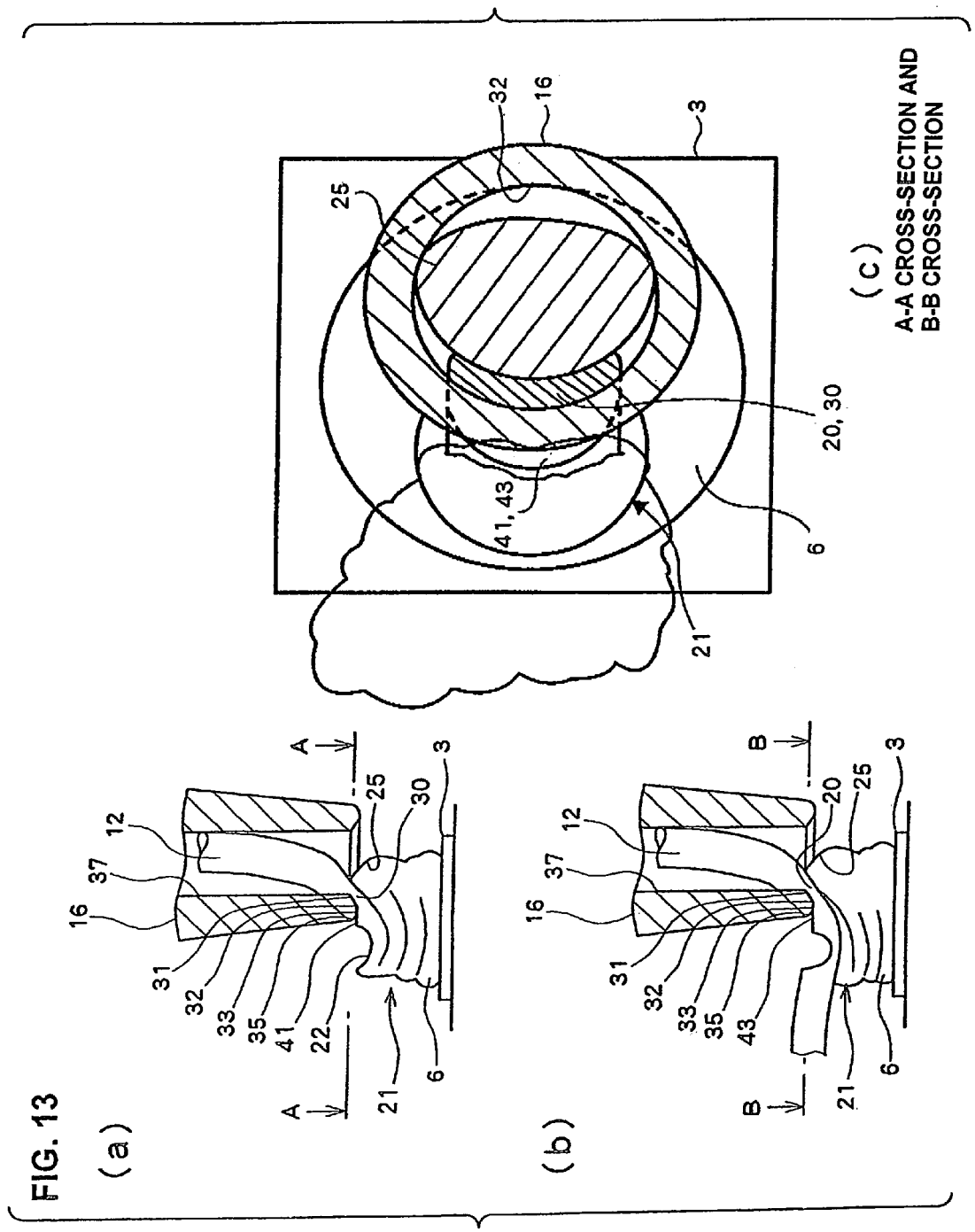

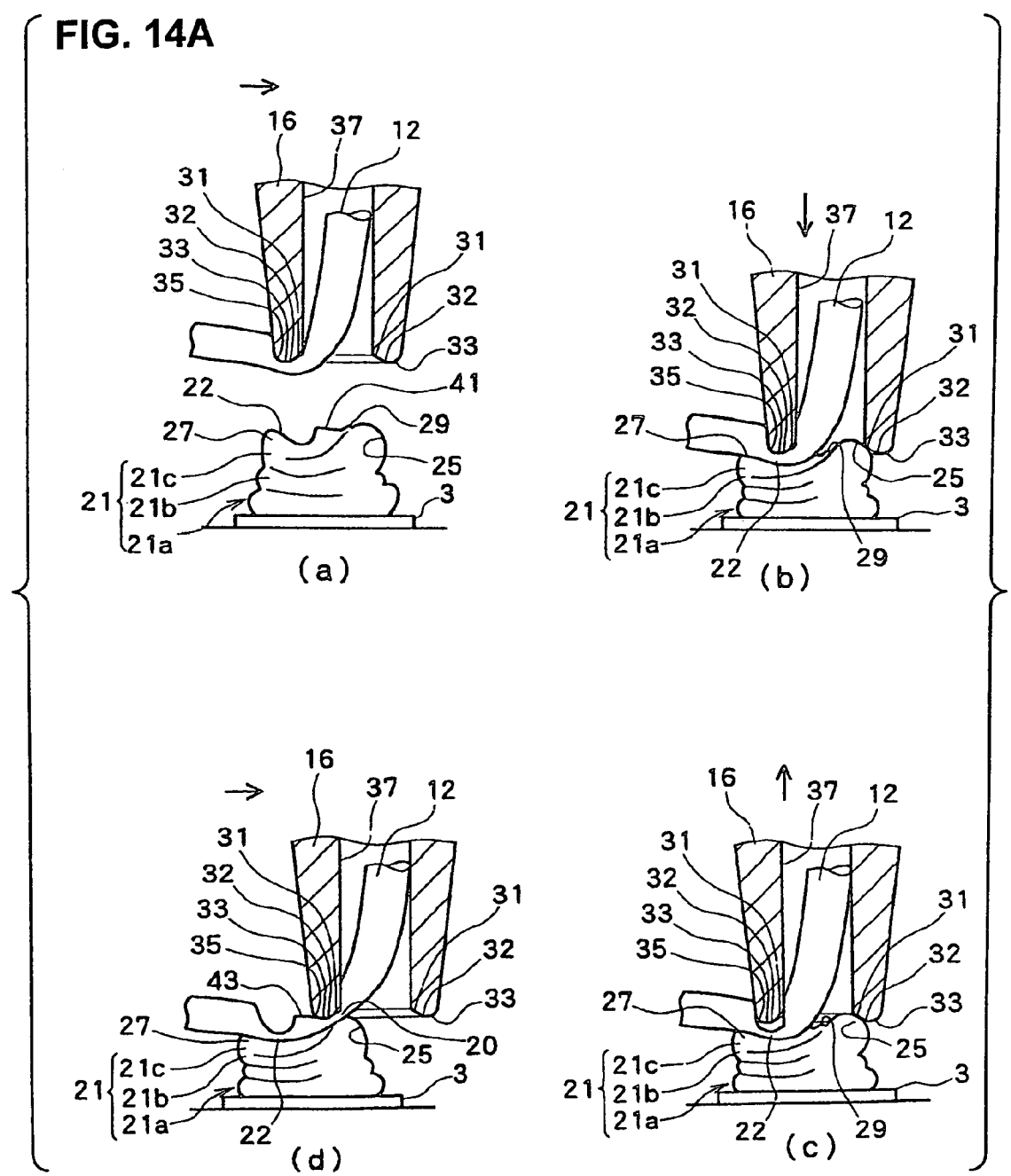

FIG. 15
RELATED ART
(a)
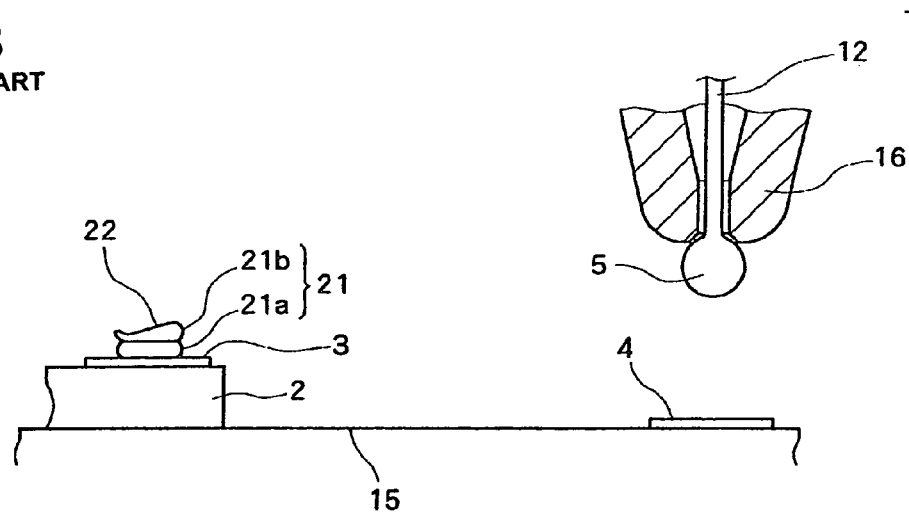
(b)
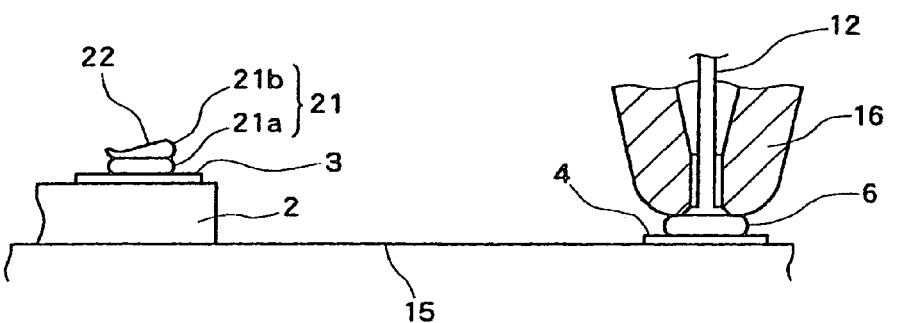
(c)
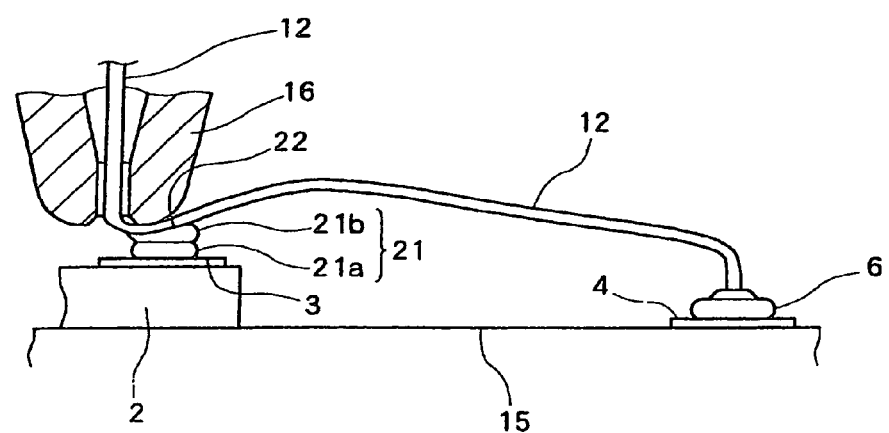

SEMICONDUCTOR DEVICE AND WIRE BONDING METHOD

BACKGROUND OF THE INVENTION

The present invention relates to semiconductor devices and wire bonding methods.

Assembling steps of a semiconductor device such as an IC includes a wire bonding step for connecting between a chip and a lead frame of a semiconductor using a wire. In a commonly employed method for the wire bonding step, a capillary through which a wire is threaded is used, a discharge from a flame off electrode forms a ball at a tip end of the wire protruding from the capillary, the capillary is moved above a pad of a semiconductor chip to perform primary bonding, and then the capillary is moved above a lead of the lead frame to perform secondary bonding, thereby connecting between the semiconductor chip and the lead frame using the wire (for example, see Japanese Patent No. 3570551).

In this case, a gold wire is typically used as the wire. Although gold exhibits excellent bondability with the same gold material, the bondability of gold with a material such as copper, nickel, or flash gold plating is low. In a case in which the pad or the lead is made of a material whose bondability with gold wire is low, such as copper, nickel, or flash gold plating, for example, the gold wire cannot be bonded directly on the bad or the lead. For this reason, in a commonly employed method, a bump is formed on the pad or the lead by ball bonding using a gold wire, and then the gold wire is bonded on the bump.

According to this method, the bondability of the gold wire increases because the gold wire is bonded on the bump that is made of the same gold material and the bondability between the gold wire and the pad or the lead that is made of a material having low bondability with gold can be improved. However, problems have been noted that, when there is not provided a sufficient size of a slope and a flat surface on an upper surface of the bump for the bonding by the gold wire, a bonding defect can occur due to a lack of the bonding area, i.e. the gold wire deforms downward after bonding the bump with the gold wire and is brought into contact with the lead frame or a semiconductor chip 2.

Therefore, in order to provide a sufficient size of a slope and a flat surface on an upper surface of the bump for the bonding by the gold wire, Japanese Patent No. 3570551 and Japanese Patent Application Unexamined Publication No. 2004-247672 propose a method of forming a slope wedge by pushing the capillary after ball bonding to bond a gold wire to the slope wedge on the bump.

According to this method, as shown in (a) in FIG. 15, for example, a bump 21 comprised of a first bump layer 21a and a second bump layer 21b is formed on a pad 3 of the semiconductor chip 2 so that a direction of a slope surface of a slope wedge 22 is opposite from a lead 4, and a ball 5 is formed at a tip end of a wire 12 by a discharge spark to the wire 12. Then, there is a wire bonding method in which primary bonding is performed in which the ball 5 is pressed on the lead 4 to form a pressure-bonded ball 6 as shown in (b) in FIG. 15. After secondary bonding is performed in which a capillary 16 is moved from the lead 4 toward the pad 3 to loop the wire 12 and the wire 12 is pressed onto the slope wedge 22 of the bump 21 as shown in (c) in FIG. 15, the wire 12 is cut. Further, there is a wire bonding method in which, as shown in FIG. 16, the primary bonding is performed to the pad 3 of the semiconductor chip 2 by forming the bump 21 having the slope wedge 22 whose direction of the slope surface is opposite from the semiconductor chip 2 on the lead 4 to form the pressure-bonded ball 6, and then, the secondary bonding is performed to the slope wedge 22 of the bump 21 by looping the wire 12 toward the lead 4. According to these methods, the wire 12 is bonded along the slope wedge 22 of the bump 21. This increases the bonding area of the slope wedge 22, and improves the bonding intensity. In addition, because the wire 12 is supported by the slope wedge 22, it is possible to prevent the wire 12 from being brought into contact with the semiconductor chip or the lead frame 15.

On the other hand, in cutting the wire in the wire bonding step, a problem has been noted that a bend is caused at the tip end of the wire. This results in a problem that the connected wire after the bonding is bent in an S shape and a defect that adjacent wires are brought into contact with each other can occur. To address this problem, methods have been proposed, for example, such that positions of the capillary and a clamper are shifted in a traverse direction before the wire is pulled up to be cut, and then, a thin wire bent portion is pulled directly upward and cut (for example, see Japanese Patent No. 2723277), and such that, after a tail wire is lead out by opening the clamper, the capillary is vibrated at a characteristic frequency of the tail wire to have the tail wire vibrate sympathetically and the wire is cut at the thin wire bent portion, thereby preventing the wire bending from occurring when cutting the wire (for example, see Japanese Patent No. 2969953).

However, as shown in FIG. 17, when the bonding area between the wire 12 and the bump 21 is increased by bonding the wire 12 onto the slope wedge 22 on the bump 21, the shape of a wire bent portion 20 between the wire 12 and the bump 21 does not become thin in some cases. In such a case, in the conventional art as described in Japanese Patent No. 2723277, a large tensile force is applied on the wire 12 and the wire 12 is cut after being extended by the thick wire bent portion 20, when the clamper 17 holds the wire 12 to pull the wire up. Accordingly, the extended wire 12 is bent upward due to reaction force in the cutting and forms the S shape. The bend of the wire 12 causes problems such as a defect in the ball formation due to a discharge when bonding the pad 3, and a defect that the wire 12 is bent to form the S shape as shown in FIG. 18, and the adjacent wires 12 are brought into contact with each other because of the bonding by the bent wire remaining in the capillary 16 and between the capillary 16 and the clamper 17.

Further, the conventional art as described in Japanese Patent No. 2969953 adversely requires an application of ultrasonic vibration for an extended period of time in order to cut the thick wire bent portion 20, and therefore cannot be applied to a high speed bonding apparatus using a short tail wire, since the technique of No. 2969953 cannot use a short tail wire because resonance of a tail wire 18 of the wire 12 that is lead between the capillary 16 and a bonding point is created.

As described above, when connecting between the pad 3 of the semiconductor chip 2 or the lead 4 of the lead frame 15 that are made of a metal material having low bondability with the wire using the wire 12, formation of the bump 21 having a shape providing excellent bondability in order to improve the bondability and cutting property of the wire 12 after bonding to the bump 21 are conflicting. In the conventional art, a problem has been noted that an improvement of the bondability lowers the cutting property of the wire 12, and thus results in an occurrence of the bend of the wire 12.

BRIEF SUMMARY OF THE INVENTION

In view of the above problems, an object of the present invention is to provide improved bonding quality by improving bondability between a wire and a bump as well as the cutting property of the wire.

A semiconductor device according to the present invention for connecting between a first bonding point and a second bonding point using a wire includes: a bump that is formed by folding the wire to be stacked on the second bonding point, the bump including a bent wire convex portion on an opposite side from the first bonding point; and the wire that extends from a side of the first bonding point toward the bump and is bonded on an upper surface of the bump, the wire having a cut surface smaller than a cross-section of the wire on a side of the bent wire convex portion.

A semiconductor device according to the present invention for connecting between a first bonding point and a second bonding point using a wire includes: a bump that is formed by folding the wire to be stacked on the second bonding point, the bump including bent wire convex portions on a side of the first bonding point and an opposite side from the first bonding point; and the wire that extends from a side of the first bonding point toward the bump and is bonded on an upper surface of the bump, the wire having a cut surface smaller than a cross-section of the wire on a side of the bent wire convex portion that is on the opposite side from the first bonding point.

Further, the semiconductor device according to the present invention can be such that the bump is provided with a sloped wedge formed by folding the wire to be stacked on the second bonding point and having a sloped surface on the upper surface of the bump, and the wire is bonded to the upper surface of the bump along the sloped wedge. The semiconductor device according to the present invention can also be such that the sloped wedge has a sloped surface whose height decreases from the first bonding point toward the second bonding point. The semiconductor device according to the present invention can also be such that the cut surface has a bow-shaped cross section.

A semiconductor device according to the present invention for connecting between a first bonding point and a second bonding point using a wire includes: a bump that is formed by folding the wire to be stacked on the second bonding point, the bump including a bent wire convex portion on an opposite side from the first bonding point; and the wire that extends from a side of the first bonding point toward the bump is bonded on an upper surface of the bump, the wire having a tensile cut surface smaller than a shear cut surface and a cross-section of the wire on a side of the bent wire convex portion.

A semiconductor device according to the present invention for connecting between a first bonding point and a second bonding point using a wire includes: a bump that is formed by folding the wire to be stacked on the second bonding point, the bump including bent wire convex portions on a side of the first bonding point and an opposite side from the first bonding point; and the wire that extends from a side of the first bonding point toward the bump is bonded on an upper surface of the bump, the wire having a tensile cut surface smaller than a shear cut surface and a cross-section of the wire on a side of the bent wire convex portion that is on the opposite side from the first bonding point.

Further, the semiconductor device according to the present invention can be such that the bump includes a sloped wedge provided on a upper surface of the bump on the side of the first bonding point, and the sloped surface has a height that decreases from the first bonding point toward the second bonding point, and the wire is bonded to the upper surface of the bump along the sloped wedge. The semiconductor device according to the present invention can also be such that the bump includes a sloped wedge provided on a upper surface of the bump so as to be adjacent to the bent wire convex portion on the side of the first bonding point, and the height of the sloped wedge surface decreases from the first bonding point toward the second bonding point, and the wire is bonded to the upper surface of the bump along the sloped wedge. The semiconductor device according to the present invention can also be such that the shear cut surface is substantially parallel with a surface of the semiconductor device including the second bonding point, and the tensile cut surface has a bow-shaped cross section.

A wire bonding method for connecting between a first bonding point and a second bonding point using a wire according to the present invention includes: a bump forming step for forming a bump by folding the wire to be stacked on the second bonding point, the bump includes a bent wire convex portion on an opposite side from the first bonding point; a bonding step for looping the wire from the first bonding point toward the bump, positioning an inner chamfer of a capillary above a bent wire convex portion, bonding the wire by pressing the wire to an upper surface of the bump with a face portion at a tip end of the capillary, and forming a wire bent portion having a cut surface smaller than a cross-section of the wire by pressing the wire to the bent wire convex portion with the inner chamfer; and a wire cutting step for pulling the wire up and cutting the wire at the wire bent portion. Further, the wire bonding method according to the present invention can be such that the bump forming step includes a sloped wedge forming step for forming a sloped wedge by folding the wire to be stacked on the second bonding point and pressing the wire to the bent wire convex portion with the face portion at the tip end of the capillary, and the bonding step bonds the wire by pressing the wire to the sloped wedge. The wire bonding method according to the present invention can also be such that the wire bent portion has a bow-shaped cross section.

A wire bonding method for connecting between a first bonding point and a second bonding point using a wire according to the present invention includes: a bump forming step for forming a bump by folding the wire to be stacked on the second bonding point, the bump including a bent wire convex portion on an opposite side from the first bonding point; a bonding step for looping the wire from the first bonding point toward the bump, and bonding the wire by pressing the wire to an upper surface of the bump with a face portion at a tip end of the capillary; a bent portion forming step for, after raising the capillary from an upper surface of the bump to a position at which a height of a tip end of the capillary is lower than a height of an upper end of the bent wire convex portion, moving the capillary from the first bonding point in a direction toward the bent wire convex portion, shearing a portion of the wire with a corner of the capillary, and forming a wire bent portion having a cut surface smaller than a cross-section of the wire by pressing the wire to the bent wire convex portion with the inner chamfer of the capillary; and a wire cutting step comprising pulling the wire up and cutting the wire at the wire bent portion.

A wire bonding method for connecting between a first bonding point and a second bonding point using a wire according to the present invention includes: a bump forming step including: forming a bump by folding the wire to be stacked on the second bonding point, the bump including a bent wire convex portion on an opposite side from the first bonding point, forming a sloped wedge on an upper surface on the side of the first bonding point by pressing the wire with the face portion at the tip end of the capillary, moving the capillary from the sloped wedge in a direction toward the bent wire convex portion after raising the capillary from an upper surface of the sloped wedge to a position at which a height of a tip end of the capillary is lower than a height of an upper end of the bent wire convex portion, shearing a portion of the wire with a corner of the capillary, and forming a wire bent portion having a cut surface smaller than a cross-section of the wire by pressing the wire to the bent wire convex portion with the inner chamfer of the capillary, and pulling the wire up and cutting the wire at the wire bent portion; a bonding step for looping the wire from the first bonding point toward the bump, and bonding the wire by pressing the wire to an upper surface of the bump with a face portion at a tip end of the capillary; a bent portion forming step for, after raising the capillary from an upper surface of the sloped wedge to a position at which a height of a tip end of the capillary is lower than a height of an upper end of the bent wire convex portion, moving the capillary from the sloped wedge in a direction toward the bent wire convex portion, shearing a portion of the wire with a corner of the capillary, and forming a wire bent portion having a cut surface smaller than a cross-section of the wire by pressing the wire to the bent wire convex portion with the inner chamfer of the capillary; and a wire cutting step comprising pulling the wire up and cutting the wire at the wire bent portion.

Further, the wire bonding method according to the present invention can also be such that the shear cut surface is substantially parallel with a surface of the semiconductor device including the second bonding point, and the wire bent portion has a bow-shaped cross section.

The present invention provides an advantageous effect of improving the bonding quality by improving bondability between the wire and the bump as well as the cutting property of the wire.

BRIEF DESCRIPTION OF THE SEVERAL VIEWS OF THE DRAWINGS

The above mentioned features and objects of the present invention will become more apparent with reference to the following drawings in which like elements are given like reference numerals and in which:

FIG. 5 shows a wire compressed to form the bow-shaped wire bent portion in which (a) and (b) are side views thereof and (c) is a sectional view thereof, taken respectively along the lines A-A in (a) and B-B in (b), showing the cutting portions of the wire on an upper surface of the bump of the semiconductor device according to the embodiment of the present invention;

FIGS. 12A and 12B are illustrative views showing the steps of forming a bump on a semiconductor chip of the semiconductor device according to the different embodiment of the present invention;

FIG. 13 shows a wire compressed to form the bow-shaped wire bent portion in which (a) and (b) are side views thereof and (c) is a sectional view thereof, taken respectively along the lines A-A in (a) and B-B in (b), showing the cutting portions of the wire on an upper surface of the bump of the semiconductor device according to the different embodiment of the present invention;

FIGS. 14A and 14B are illustrative views showing the steps of bonding the wire to the bump on the semiconductor chip the semiconductor device according to the different embodiment of the present invention;

FIG. 15 is an illustrative view showing the bonding steps of a wire of the semiconductor device according to the conventional art;

DETAILED DESCRIPTION OF THE INVENTION

The following describes the preferred embodiments according to the present invention with reference to the drawings.

First Embodiment

Figure 1:
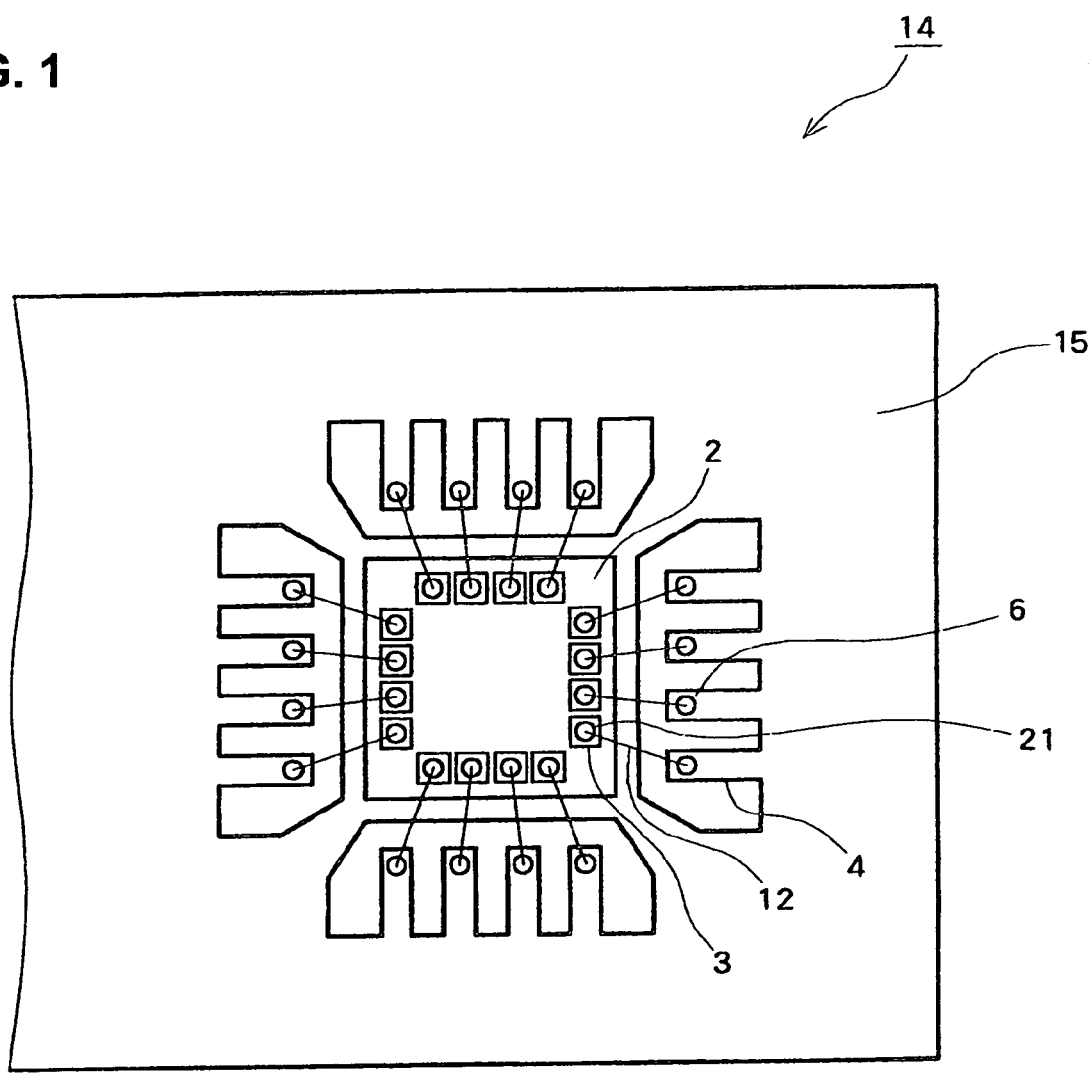
FIG. 1 is a plan view of a semiconductor device according to an embodiment of the present invention.

As shown in FIG. 1, a semiconductor device 14 of an embodiment according to the present invention is provided with a lead frame 15 on which a lead 4 is provided, a semiconductor chip 2 mounted to the lead frame 15 by die bonding, a bump 21 that is formed on a pad 3 formed on the semiconductor chip 2, and a wire 12 that connects between the lead 4 and the bump 21. The wire 12 is looped bonded from a pressure-bonded ball 6 formed on the lead 4 by bonding toward the bump 21. The wire 12 is comprised of a gold wire, and the pad 3 and the lead 4 are comprised of a material such as copper, nickel, and flash gold plating that have low bondability with gold.

Figure 2:
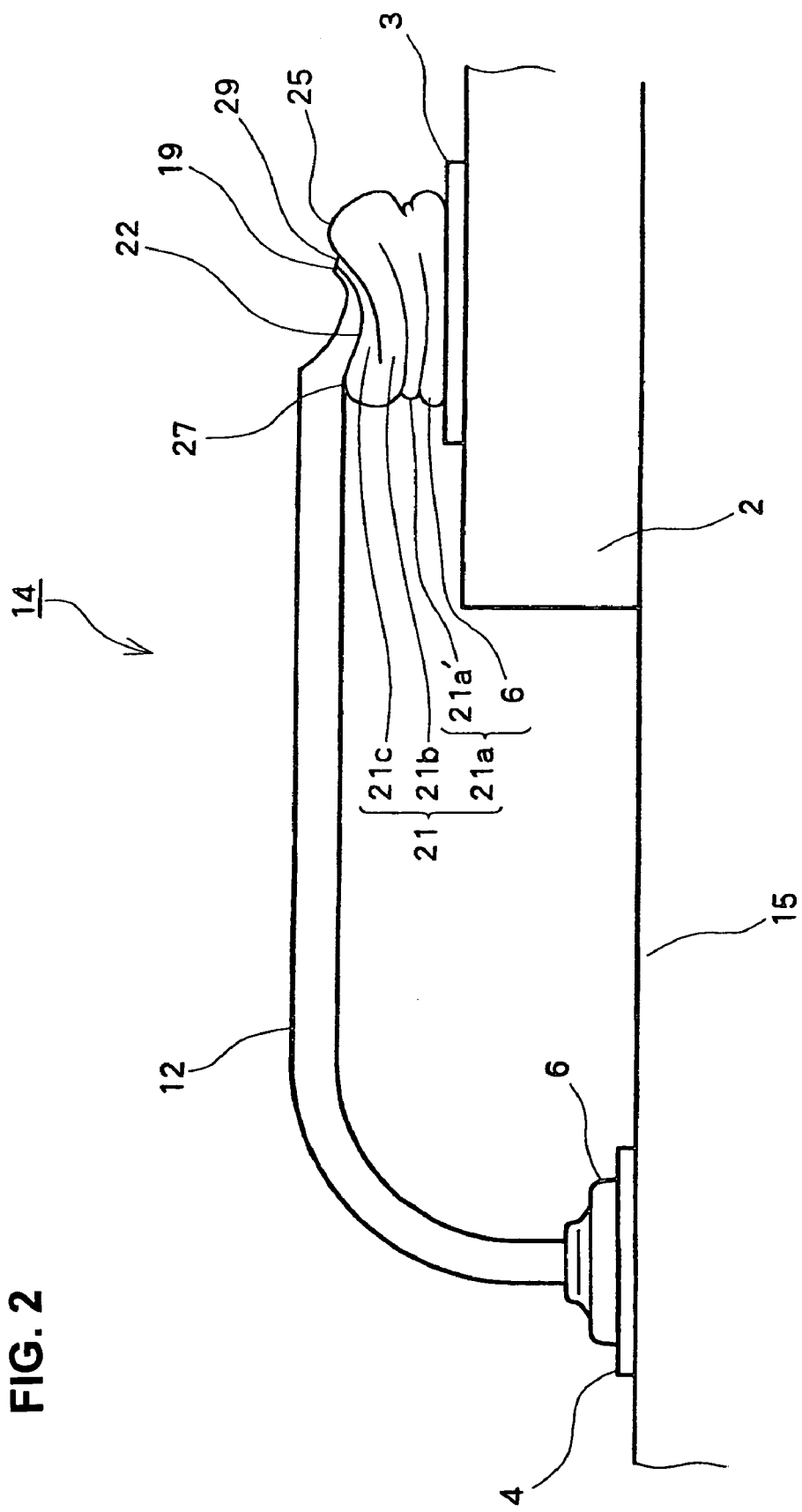
FIG. 2 is a side view showing a connection wire and a bump between a lead frame and a semiconductor chip of the semiconductor device according to the embodiment of the present invention.

As shown in FIG. 2, the bump 21 formed on the pad 3 is configured such that the wire 12 is folded and stacked on the pad 3, and includes, from a surface of the pad 3, a first bump layer 21a comprised of the pressure-bonded ball 6 and a the bump wire 21a' that is pressed to the pressure-bonded ball 6, a first bent wire convex portion 25 formed on an opposite side from the lead 4, a second bump layer 21b formed by pressing the wire 12 over the first bump, a second bent wire convex portion 27 formed on a side of the lead 4, a sloped wedge 22 on a upper surface of the bump, and a wire cut surface 29 formed by cutting the wire 12 when the wire 12 is folded to form the bump 21. The wire 12 is looped toward the bump 21 after the pressure-bonded ball 6 is formed on the lead 4 as a first bonding point by primary bonding, and then bonded to the sloped wedge 22 on the upper surface of the bump 21 formed on the pad 3 as a second bonding point. The wire 12 has a wire cut surface 19 on a side of the first bent wire convex portion 25 formed on a side opposite from the lead 4 of the bump 21.

The upper surface of the bump 21 has a concave portion at a middle of the upper surface, and the first and second bent wire convex portions 25 and 27 respectively on both sides of the bump 21 along a connecting direction of the wire 12 protrude upward. The sloped wedge 22 is a sloped flat surface formed from the concave portion at the middle toward the second bent wire convex portion 27 on the side of the lead 4 as the first bonding point. As described above, the sloped wedge 22 is formed such that the height of the slope is high on the side of the lead 4 as the first bonding point, and then reduces its height from the first bonding point toward the pad 3 as the second bonding point. The wire 12 is bonded along a surface of the sloped wedge 22.

The upper surface of the bump 21 has a slope formed such that the slope increases its height from the concave portion at the middle toward the first bent wire convex portion 25 on an opposite side of the lead 4 as the first bonding point. A wire cut surface 29 in bump formation and the wire cut surface 19 in wire bonding are positioned along the first bent wire convex portion 25.

Figure 3:
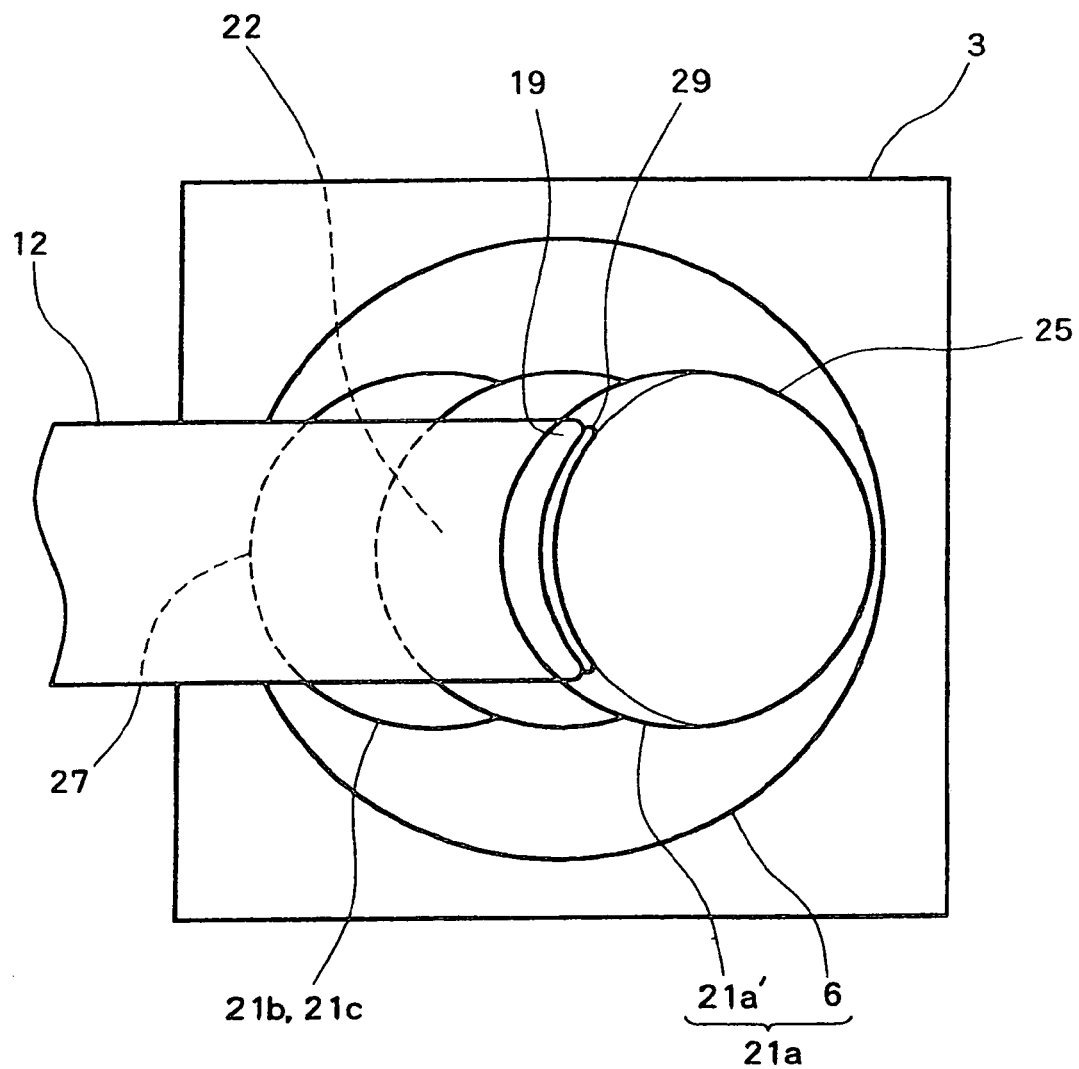
FIG. 3 is a plan view of the bump formed on the semiconductor device according to the embodiment of the present invention.

FIG. 3 is a plan view showing the bump 21 and the wire 12 bonded thereto. As shown in FIG. 3, the first bent wire convex portion 25 of the bump 21 extends toward an opposite side of the lead 4 as the first bonding point, and the second bent wire convex portion 27 extends toward the lead 4 as the first bonding point. As can be seen from FIG. 1 and FIG. 2, the first bent wire convex portion 25 is substantially a semi-spherical protrusion extending toward the upper surface of the bump 21, the second bent wire convex portion 27 is a partially spherical protrusion whose portion on the side of the lead 4 as the first bonding point extends toward the upper surface of the bump 21 and whose portion on the opposite side is a slope surface of the sloped wedge 22.

Each of the wire cut surfaces 19 and 29 has a bow-shaped cut surface. The wire cut surface 29 of the wire 12 formed in bump formation can be positioned between the wire cut surface 19 of the wire 12 formed during wire bonding and the first bent wire convex portion, or can be positioned below the wire cut surface 19 and between the wire cut surface 19 and a second bump layer 21b.

Figure 4A:
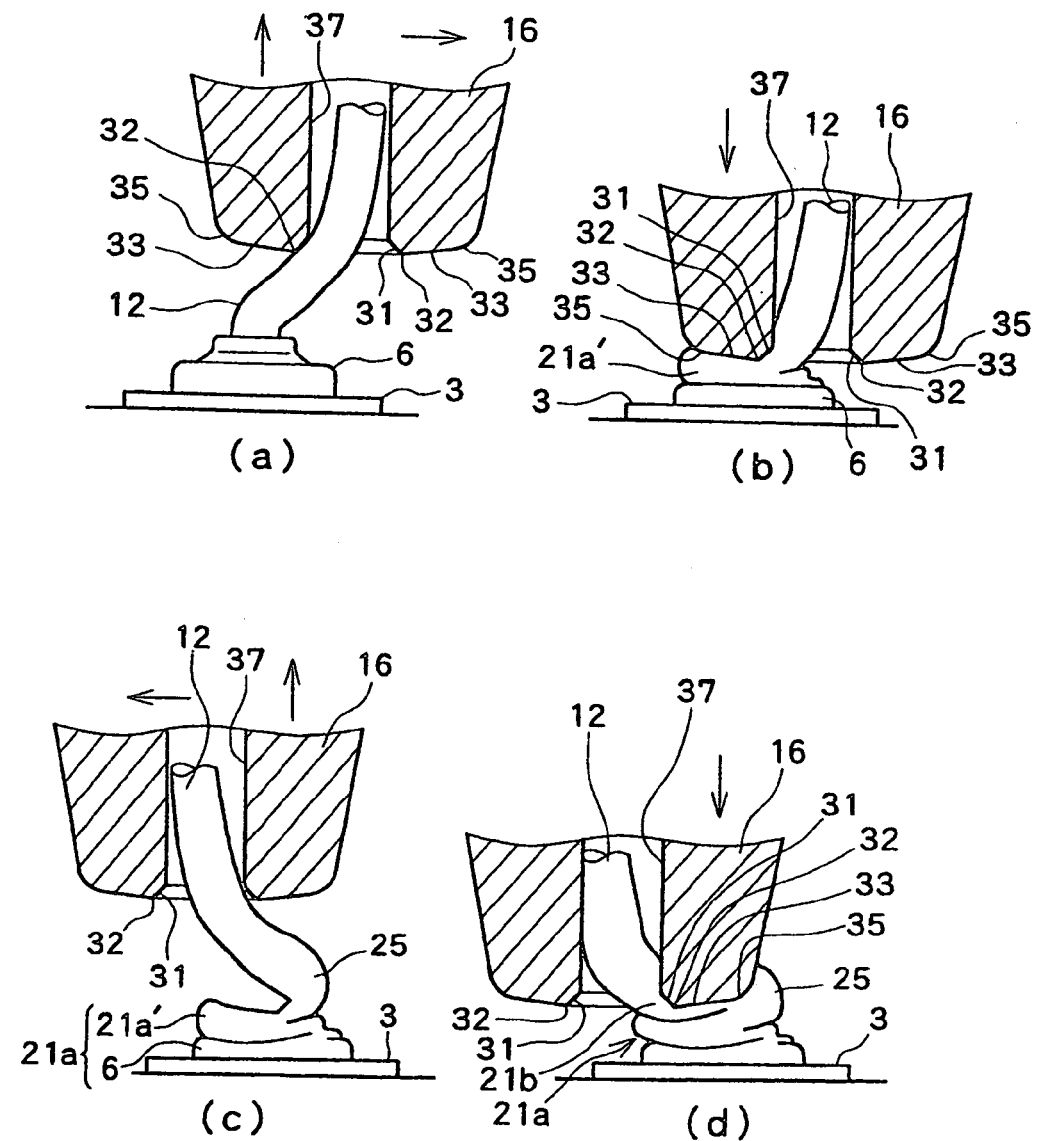
FIGS. 4A and 4B are illustrative views showing the steps of forming a bump on a semiconductor chip of the semiconductor device according to the embodiment of the present invention.
Figure 4B:
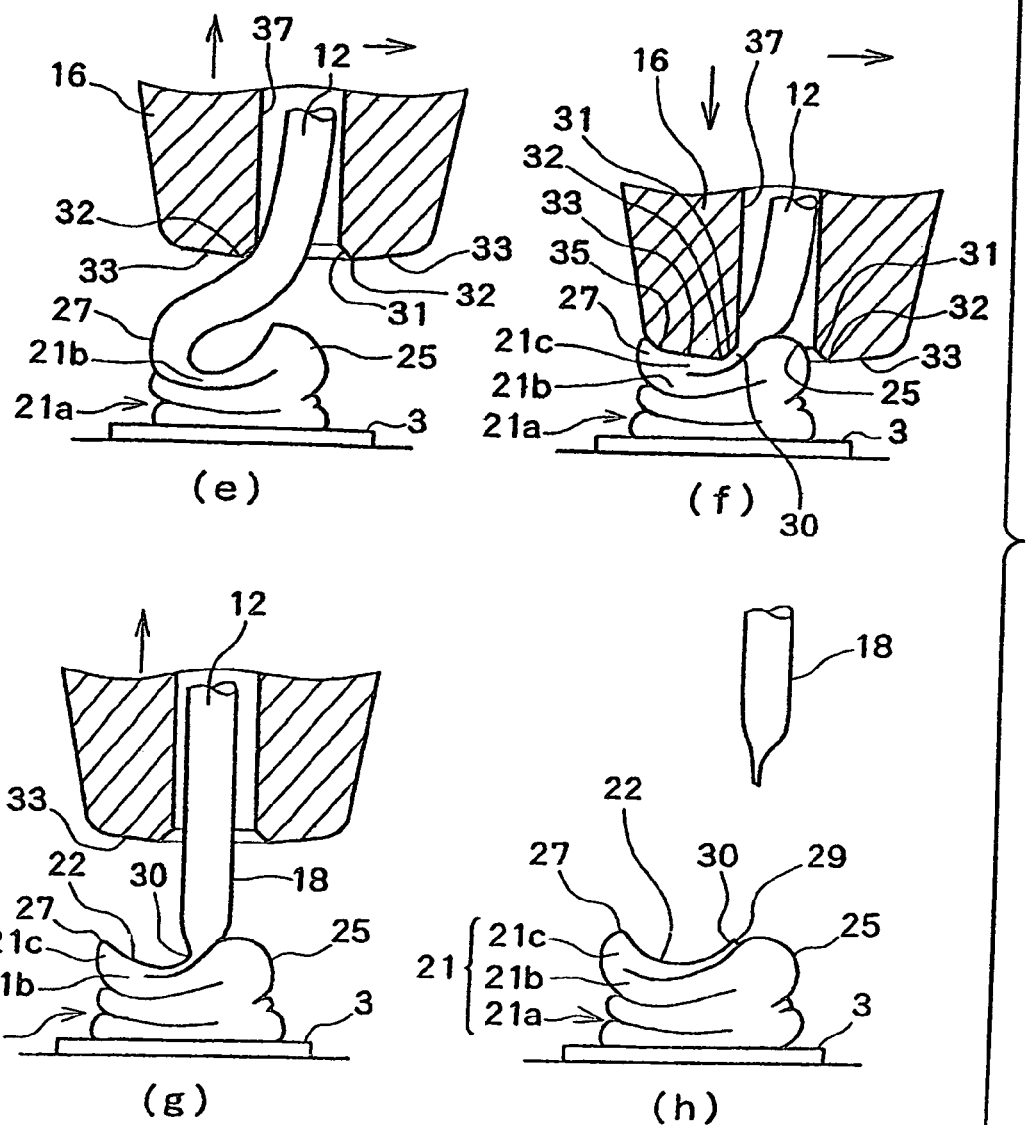

The structure of the capillary 16 is first described before describing an operation for forming the bump 21. As shown in FIGS. 4A and 4B, the capillary 16 includes an inner chamfer 31, a face portion 33, an outer radius portion 35, and a straight hole 37, and is made of a hard material such as ceramics. The face portion 33 is provided at a tip end surface of the capillary 16, which is a flat surface forming a slight angle to the pad 3. The face portion 33 pressure bonds the ball 5 formed at the tip end of the wire 12 and the folded wire 12 to the pad 3 of the semiconductor chip 2 using the flat surface of the capillary 16. The straight hole 37 is a through hole provided through a center of the capillary 16 and having a diameter slightly greater than an outer diameter of the wire 12, and the wire 12 is inserted through the straight hole 37. The inner chamfer 31 is a tapered hole provided between the straight hole 37 and the face portion 33, and is tapered toward the face portion 33. The inner chamfer 31 presses the ball 5 onto the pad 3 in bonding, and compresses the ball in a radial direction to form the pressure-bonded ball 6. The inner chamfer 31 also includes a corner 32 between the inner chamfer 31 and the face portion 33. Because the face portion 33 has a slight angle to the pad 3, when the face portion 33 of the capillary 16 is pressed to the wire 12, the corner 32 between the inner chamfer 31 and the face portion 33 is configured to dig into the wire 12.

Referring to FIGS. 4A and 4B, a step for forming the bump 21 on the pad 3 of the semiconductor chip 2 of the semiconductor device 14 according to this embodiment is described. The bump 21 is formed by moving the capillary 16 as a bonding tool through which the wire 12 is inserted using a wire bonding apparatus that is not shown in the drawing.

As shown in (a) in FIG. 4A, after forming the pressure-bonded ball 6 by pressing the ball formed at the tip end of the wire 12 onto the pad 3, the capillary 16 moves upward and then toward right in the FIG. 4 which is an opposite direction from the lead 4 as the first bonding point. When the capillary 16 moves in a transverse direction, because the wire 12 is bonded to the pad 3 by the pressure-bonded ball 6, the inner chamfer 31 of the capillary 16 is brought into contact with an outer surface of the wire 12 and the wire 12 is bent and deforms in a direction of the transverse movement of the capillary 16. Then, the capillary 16 moves along the transverse direction until the face portion 33 on the side of the lead 4 is positioned over a center of the pressure-bonded ball 6 so that the wire 12 comes between the face portion 33 and the pressure-bonded ball 6.

As shown in (b) in FIG. 4A, the capillary 16 moves downward, and presses the wire 12 between the face portion 33 on the side of the lead 4 and the pressure-bonded ball 6 onto a surface of the pad 3 using the face portion 33 on the side of the lead 4. The wire 12 is then pressed onto the pressure-bonded ball 6 and becomes flattened to form a bump wire 21a'. The first bump layer 21a is formed by the pressure-bonded ball 6 and the bump wire 21a' formed in a flattened shape. Further, the wire 12 inserted through the capillary 16 and the first bump layer 21a are continuous on the opposite side of the lead 4 of the bump 21. The continuous portion of the wire 12 is pressed downward by the inner chamfer 31 of the capillary 16, and accordingly, the wire 12 is formed along the tapered shape of the inner chamfer 31. With this, the wire 12 is sloped upward toward the opposite side from the lead 4 by a clearance between the straight hole 37 of the capillary 16 and the wire 12 so as to be guided through the straight hole 37.

As shown in (c) in FIG. 4A, after forming the first bump layer 21a, the capillary 16 moves upward and then toward the lead 4 in a direction that is opposite from the previously taken transverse movement. By this transverse movement of the capillary 16, the inner chamfer 31 of the capillary 16 is brought into contact with the outer surface of the wire 12. In a state in which the first bump layer 21a is formed, the wire 12 is sloped in the opposite direction from the lead 4, and therefore the wire 12 between the face portion 33 and the first bump layer 21a is bent from the opposite side of the lead 4 toward the side of the lead 4 by the transverse movement of the capillary 16 to form the first bent wire convex portion 25. Then, the capillary 16 moves toward the side of the lead 4 along the transverse direction until the face portion 33 on the opposite side from the lead 4 reaches a substantial central position of the first bump layer 21a.

As shown in (d) in FIG. 4A, after this transverse movement of the capillary 16, the capillary 16 moves downward, and presses the wire 12 between the face portion 33 and the first bump layer 21a onto the surface of the pad 3 using the face portion 33 on the opposite side of the lead 4. The wire 12 is then pressed onto the first bump layer 21a to be flattened and pressure bonded to the first bump layer 21a to form the second bump layer 21b. The first bent wire convex portion 25 is not on the face portion 33 of the capillary 16, and therefore not pressed to the pad 3 by the downward movement of the capillary 16 and forms a semi-spherical upward protrusion on the second bump layer 21b on the opposite side of the lead 4. Further, the first bent wire convex portion 25 is bent substantially by 180 degrees by the formation of the second bump layer 21b by the downward movement of the capillary 16. Accordingly, the first bent wire convex portion 25 has a higher degree of hardness than other portions due to work hardening by bending. Moreover, the wire 12 inserted through the capillary 16 and the second bump layer 21b are continuous on the side of the lead 4 of the bump 21. The continuous portion of the wire 12 is pressed downward by the inner chamfer 31 of the capillary 16, and accordingly, the wire 12 is formed along the tapered shape of the inner chamfer 31. With this, the wire 12 slopes upward toward the side from the lead 4 by a clearance between the straight hole 37 of the capillary 16 and the wire 12 so as to be guided through the straight hole 37.

As shown in (e) FIG. 4B, after forming the second bump layer 21b and the first bent wire convex portion 25, the capillary 16 moves upward and then toward the side from the lead 4 that is opposite from the previously taken transverse movement. By this transverse movement of the capillary 16, the inner chamfer 31 of the capillary 16 is brought into contact with the outer surface of the wire 12. In a state in which the second bump layer 21b is formed, the wire 12 is sloped toward the side of the lead 4, and therefore the wire 12 between the face portion 33 and the second bump layer 21b is bent from the side of the lead 4 toward the opposite side of the lead 4 by this transverse movement of the capillary 16 to form the second bent wire convex portion 27. Then, the capillary 16 moves toward a position at which a center position of the straight hole 37 is substantially at a center position of the first bent wire convex portion 25. Once the center position of the capillary 16 reaches the center position of the straight hole 37, the second bent wire convex portion 27 comes outside the face portion 33 of the capillary 16, and is partially positioned closer to the side of the lead 4 than to the outer radius portion 35.

As shown in (f) in FIG. 4B after this transverse movement of the capillary 16, the capillary 16 moves downward such that the first bent wire convex portion 25 having a semi-spherical shape projects into the straight hole 37, and presses the wire 12 between the face portion 33 and the second bump layer 21b toward the pad 3 using the face portion 33 on the side of the lead 4. The wire 12 is then pressed onto the second bump layer 21b to be flattened and pressure bonded to the second bump layer 21b to form a third bump layer 21c. The wire 12 inserted through the capillary 16 and the third bump layer 21c are continuous on the opposite side of the lead 4 of the bump 21. The continuous portion of the wire 12 is pressed onto the first bent wire convex portion 25 on the side of the pad 3 by the inner chamfer 31 of the capillary 16. Because the first bent wire convex portion 25 has a higher degree of hardness than other portions due to the work hardening by bending in the previous step, the wire 12 that is held between the first bent wire convex portion 25 and the inner chamfer 31 of the capillary 16 made of the hard material can be deformed by compression. Thus, the inner chamfer 31 compresses the wire 12 between the inner chamfer 31 and the first bent wire convex portion 25 by the downward movement of the capillary 16, the corner 32 of the inner chamfer 31 bites into the wire 12 to form a wire bent portion 30 having a bow-shaped cross section 29, where a cross section of a bonded portion of the wire 12 is smaller than a cross section of the wire 12.

As shown in (c) in FIG. 5, the wire 12 is compressed to form the bow-shaped wire bent portion 30 along an outer surface of the first bent wire convex portion 25 by being sandwiched between the circularly tapered inner chamfer 31 and the semi-spherical first bent wire convex portion 25. The wire bent portion 30 is positioned on the side of the lead 4 of the first bent wire convex portion 25. Then, as shown in (a) in FIG. 5, the wire 12 after the formation is sloped toward the opposite side from the lead 4 by a clearance between the straight hole 37 of the capillary 16 and the wire 12 so as to extend upward by being guided through the straight hole 37.

By the previous movement of the capillary 16, the second bent wire convex portion 27 is not on the face portion 33 of the capillary 16, and therefore not pressed to the second bump layer 21b by the downward movement of the capillary 16 and forms a partially spherical upward protrusion that is higher than a portion of the third bump layer 21c on the side of the lead 4 pressed with the face portion 33. Further, the second bent wire convex portion 27 is bent substantially by 180 degrees by the formation of the third bump layer 21c by the downward movement of the capillary 16. Accordingly, the second bent wire convex portion 27 has a higher degree of hardness than other portions due to the work hardening by bending. The sloped wedge 22 is formed between the second bent wire convex portion 27 whose upper surface is protruding and a portion of the wire onto which the corner 32 of the inner chamfer 31 pressed. The sloped wedge 22 is a surface declining from the side of the lead 4 toward the opposite side of the lead 4. The shape of the surface of the sloped wedge 22 substantially follows shape of the face portion 33 and the outer radius portion 35.

As shown in (g) in FIG. 4B, once the formation of the third bump layer 21c is completed, the capillary 16 moves upward. At this time, because the clamper that is not shown is in an open state, the upward movement of the capillary 16 leaves a tail wire 18 extend below the capillary 16.

As shown in (h) in FIG. 4B, when the capillary 16 reaches the height at which the length of the tail wire 18 is sufficient enough to form a subsequent ball, the clamper that is not shown is closed and moves up while holding the wire 12 along with the capillary 16. Then the wire 12 is pulled upward by the clamper and applied with a tensile force. In the previous step of the third bump layer 21c formation, because the wire bent portion 30 whose cross section is smaller than a cross section of the wire 12 is formed, a large tensile stress is generated at the wire bent portion 30 due to the tensile force applied to the wire 12. Then, the wire 12 is cut or torn at the wire bent portion 30 by the tensile stress to form the wire cut surface 29. Because the area of the wire bent portion 30 is made small, a total tension applied to the wire 12 in cutting the wire 12 can be small, and it is possible to suppress an occurrence of a bend to the wire 12 by a reaction of the tensile force when the wire 12 is cut. Once the wire 12 is cut, the step of forming the bump 21 that has the first bent wire convex portion 25 and the sloped wedge 22 and that is stacked on multiple times is completed.

Figure 6:
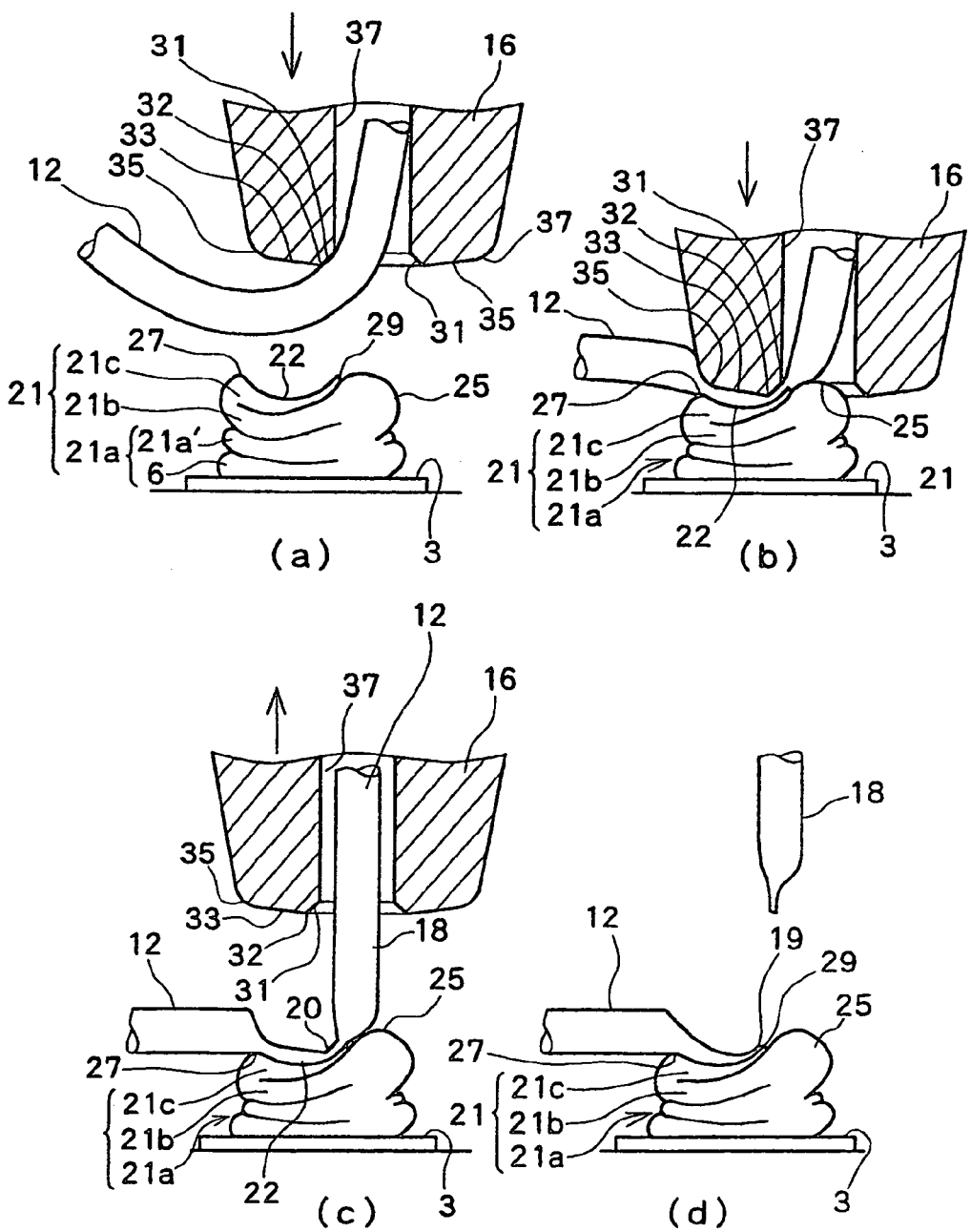
FIG. 6 is an illustrative view showing the steps of bonding the wire to the bump on the semiconductor chip the semiconductor device according to the embodiment of the present invention.

Referring to FIG. 6, a step of bonding the wire 12 onto the bump 21 formed on the pad 3 of the semiconductor chip 2 of the semiconductor device 14 according to this embodiment is explained.

As shown in (a) in FIG. 6, after first bonding to the lead 4 as the first bonding point, the wire is looped and the capillary 16 is moved so that a center of the straight hole 37 of the capillary 16 through which the wire 12 is inserted is substantially positioned at a center of the first bent wire convex portion 25 formed on the opposite side from the lead 4. Then, when the center position of the capillary 16 comes to the substantial center of the first bent wire convex portion 25, the capillary 16 is moved downward.

As shown in (b) in FIG. 6, the capillary moves downward so that the semi-spherical first bent wire convex portion 25 comes into the straight hole 37, and presses the wire 12 between the sloped wedge 22 and the face portion 33 toward the sloped wedge 22 with the face portion 33 of the side of the lead 4. Because the hardened second bent wire convex portion 27 protrudes upward on the side of the lead 4 of the bump 21 to which the wire 12 is looped, the side of the lead 4 of the wire 12 pressed downward by the face portion 33 of the capillary 16 is supported by the second bent wire convex portion 27. Then, when the capillary 16 moves further downward, the wire 12 between the face portion 33 and the slope wedge 22 is deformed into a shape following the shape of the sloped wedge 22. Then, when the capillary 16 moves further downward, the upper surface of the wire 12 is formed into a shape following the shapes of the face portion 33 and the outer radius portion 35 of the capillary 16, and a lower surface of the wire 12 is pressed to the surface of the sloped wedge 22 to be deformed into a shape following the surface of the sloped wedge 22, and the lower surface of the wire 12 is bonded to the bump 21. Because the surface of the sloped wedge 22 and the wire 12 have a large bonding area, the bondability between the wire 12 and the bump 21 is improved.

The wire 12 that extends toward the side of the lead 4 is supported by the hardened second bent wire convex portion 27, and accordingly, does not easily deform downward toward the surface of the pad 3 even when the wire 12 is pressed down by the face portion 33 and the outer radius portion 35 of the capillary 16. Therefore, it is possible to prevent the wire 12 from being brought into contact with the lead 4 or the semiconductor chip 2.

The wire 12 inserted through the capillary 16 and the upper surface of the sloped wedge 22 are continuous on the opposite side of the lead 4 of the bump 21. The continuous portion of the wire 12 is pressed onto the hardened first bent wire convex portion 25 by the inner chamfer 31 of the capillary 16, and compressed to form the wire bent portion 20 whose the cross section of a bonding portion at which the wire 12 is bonded is smaller than the cross section of the wire 12. As shown in (b) and (c) in FIG. 5, the shape and the cross section of the wire bent portion 20 are bow-shaped following the outer surface of the first bent wire convex portion 25 similarly to the wire bent portion 30 as previously described while referring to (a) and (c) in FIG. 5, and positioned on the side of the lead 4 of the first bent wire convex portion 25.

Once the bonding of the wire 12 to the bump 21 is completed, as shown in (c) in FIG. 6, the capillary 16 moves up. At this time, the clamper that is not shown is open, the tail wire 18 is lead out below the capillary 16 by the upward movement of the capillary 16.

As shown in (d) in FIG. 6, when the capillary 16 reaches a height at which the length of the tail wire 18 is sufficient enough to form a subsequent ball, the clamper that is not shown is closed and moves up while holding the wire 12 along with the capillary 16. Then the wire 12 is pulled upward by the clamper and applied with a tensile force. The wire 12 is cut at the wire bent portion 20 at which the cross section is smaller than the cross section of the wire 12. Because the area of the wire bent portion 20 is made small, it is possible to suppress an occurrence of a bend in the wire 12 by a reaction of the tensile force when the wire 12 is cut. When the wire 12 is cut, the bow-shaped wire cut surface 19 is formed that has a shape following a side surface of the first bent wire convex portion 25 on the side of the lead 4. Once the wire 12 is cut, the bonding step is completed.

According to the semiconductor device 14 of this embodiment as described above, the wire 12 is bonded to the surface of the slope wedge 22 having a large bonding area, and therefore it is possible to advantageously improve the bondability between the wire 12 and the bump 21. Further, when forming the bump 21 and when bonding the wire 12 to the bump 21, the wire 12 is held by the hardened first bent wire convex portion 25 and the inner chamfer 31 to form the wire bent portions 20 and 30 whose cross sections are respectively smaller than the cross section of the wire 12, and the wire 12 is cut at the wire bent portions 20 and 30. Accordingly, an advantageous effect can be obtained that the cutting force of the wire 12 can be small, and it is possible to suppress the occurrence of a bend in the wire 12 by the reaction. Furthermore, the wire 12 is supported by the hardened second bent wire convex portion 27 when bonding the wire 12 to the bump 21, and accordingly, does not deform downward toward the surface of the pad 3 due to the bonding. Therefore, an advantageous effect can be obtained that it is possible to prevent the wire 12 from being brought into contact with the lead 4 or the semiconductor chip 2. As described above, this embodiment provides an advantageous effect that it is possible to improve the bondability between the wire 12 and the bump 21, as well as the cutting property of the wire 12, thereby improving the bonding quality.

In the above described embodiment, an example is explained in which the bump 21 is formed on the pad 3 of the semiconductor chip 2 as the second bonding point that is higher than the lead 4 of the lead frame 15 as the first bonding point. However, the bump 21 can be formed at a position higher or lower than the first bonding point, or can be formed on the lead 4 of the lead frame 15 instead of forming on the pad 3.

Second Embodiment

The following describes another embodiment according to the present invention, referring to the drawings. Like components as used in the previously described embodiment are indicated by the like numerals, and an explanation for these components is omitted.

Figure 7:
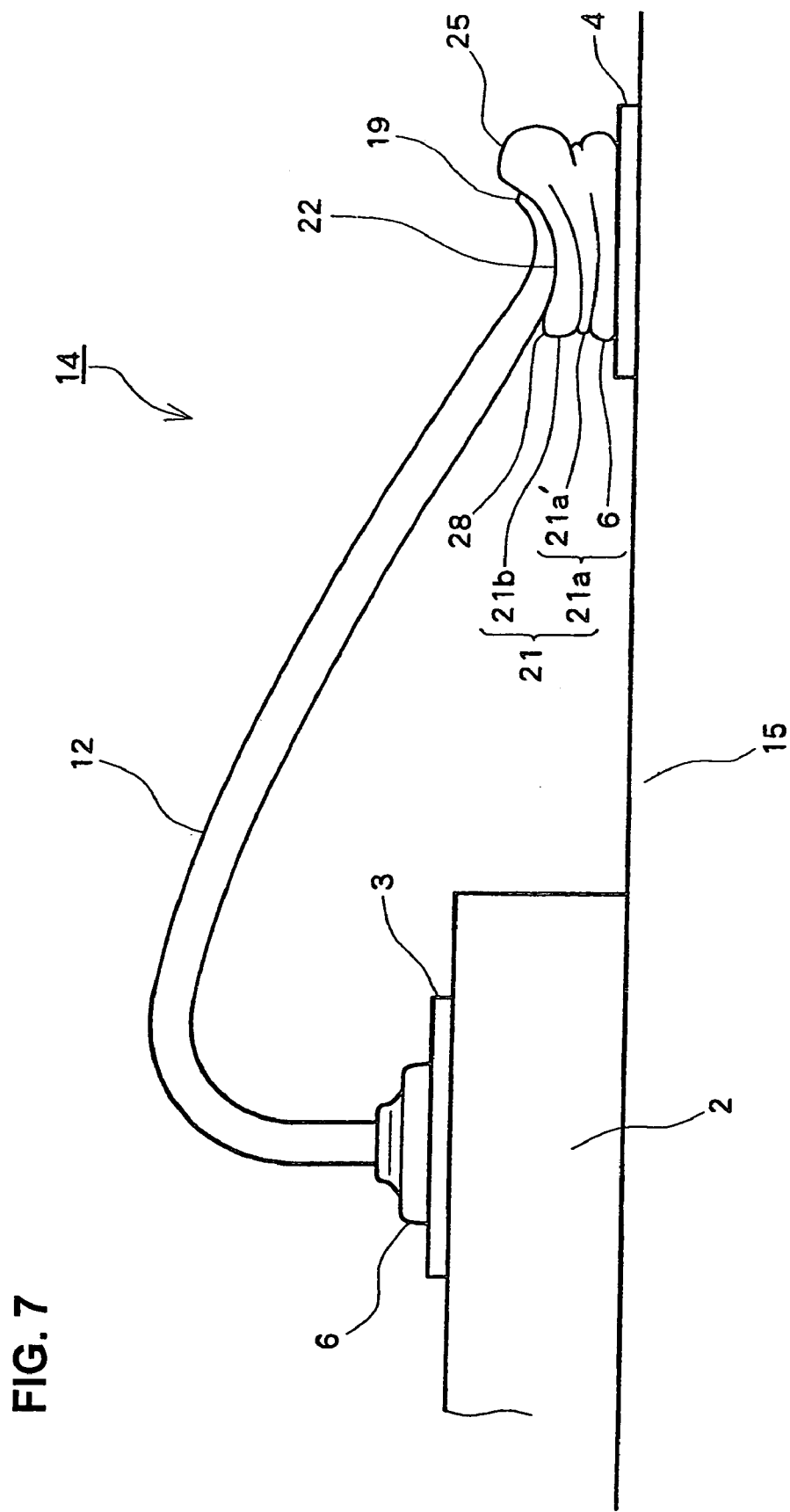
FIG. 7 is a side view showing a connection wire and a bump between a lead frame and a semiconductor chip of a semiconductor device according to a different embodiment of the present invention.

As shown in FIG. 7, the bump 21 formed on the lead 4 is configured such that the wire 12 is folded and stacked on the lead 4, and includes, from a surface of the lead 4, a first bump layer 21a comprised of the pressure-bonded ball 6 and a bump wire 21a' that is pressed to the pressure-bonded ball 6, a first bent wire convex portion 25 formed on an opposite side from the pad 3, a second bump layer 2b formed by pressing the wire 12 over the first bump layer 21a, a sloped wedge 22 on a upper surface of the bump 21, and a wire cut surface 28 formed by cutting the wire 12 when the wire 12 is folded to form the bump 21. The wire 12 is looped toward the bump 21 after the pressure-bonded ball 6 is formed on the pad 3 as a first bonding point by primary bonding, and then bonded to the sloped wedge 22 on the upper surface of the bump 21 formed on the lead 4 as a second bonding point. The wire 12 has a wire cut surface 19 on a side of the first bent wire convex portion 25 formed on a side opposite from the pad 3 of the bump 21.

Figure 8:
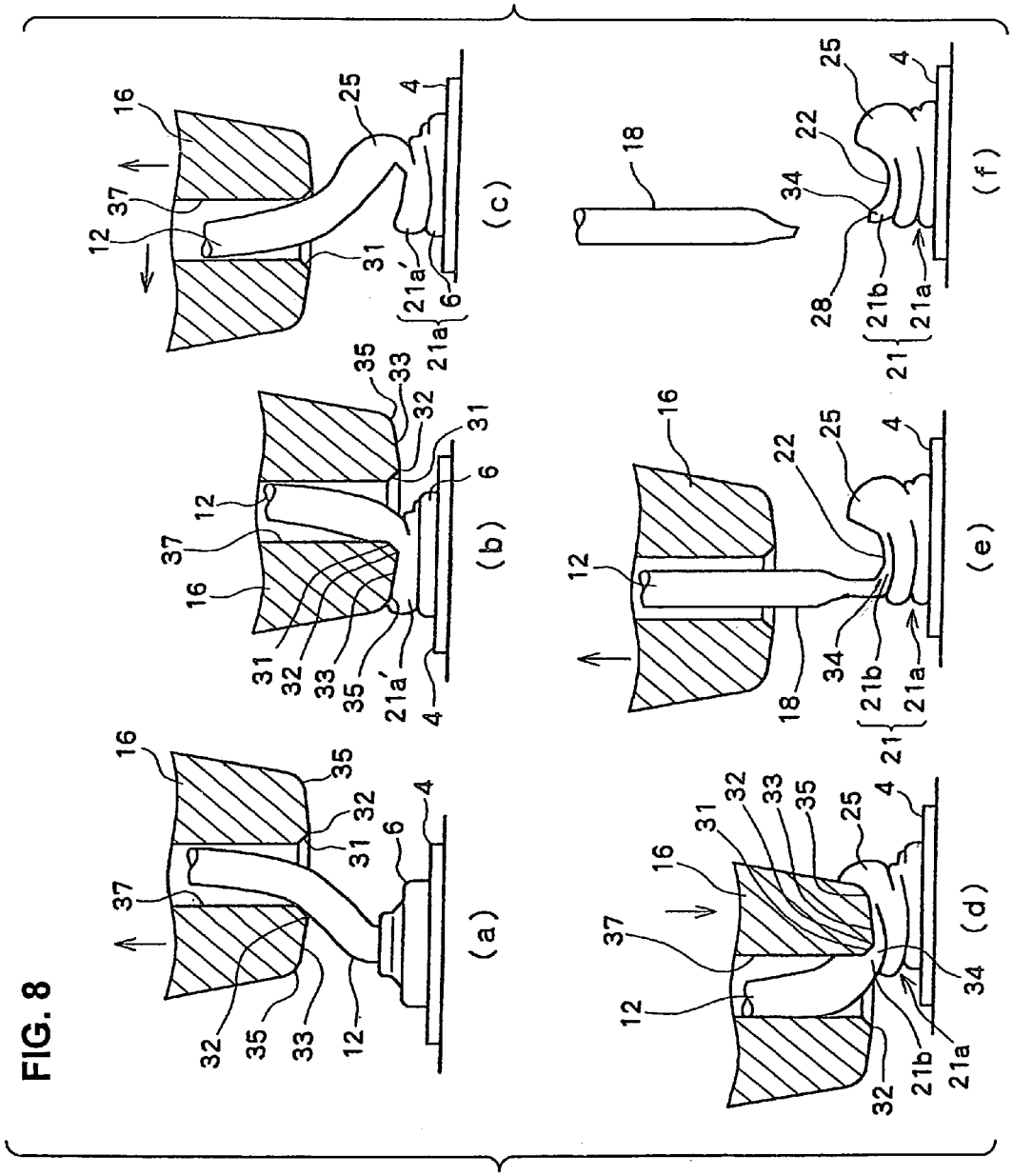
FIG. 8 is an illustrative view showing the steps of forming a bump on a semiconductor chip of the semiconductor device according to the different embodiment of the present invention.

A step of forming the bump 21 of the lead frame 15 of the semiconductor device 14 according to this embodiment is described referring to FIG. 8. A formation step of forming the bump 21 from (a) to (d) in FIG. 8 is similar to the formation step of forming the bump 21 from (a) to (d) in FIG. 4A described in the previous embodiment. In FIG. 8, the pad 3 and the lead 4 in (a) to (d) in FIG. 4A are respectively replaced by the lead 4 and the pad 3. Therefore, in FIG. 8, the first bonding point is the pad 3 of the semiconductor chip 2, and the second bonding point is the lead 4 of the lead frame 15. According to the step from (a) to (d) in FIG. 8 FIG. 8, the first bump layer 21a, the second bump layer 21b, and the first bent wire convex portion 25 are formed. By pressing the face portion 33 of the capillary 16 when forming the second bump layer 21b, the sloped wedge 22 having a slope surface is formed. The sloped wedge 22 has the sloped surface declining from the first bent wire convex portion 25 positioned opposite from the pad 3 as the first bonding point toward the pad 3. Further, the wire 12 inserted through the capillary 16 and the second bump layer 21b are continuous on the side of the pad 3 of the bump 21. A wire bent portion 34 is formed at the continuous portion of the wire 12 at which the cross section of the bonded portion of the wire 12 is smaller than the cross section of the wire 12.

As shown in (e) in FIG. 8, once the formation of the second bump layer 21b is completed, the capillary 16 moves upward with the clamper not shown in the open state. The upward movement of the capillary 16 lets the tail wire 18 extend below the capillary 16.

As shown in (f) in FIG. 8, after the capillary 16 moves up until the length of the tail wire 18 reaches a predetermined length, the clamper is closed and moves up while holding the wire 12 along with the capillary 16. Then, a large stress is applied on the wire bent portion 34 formed in the formation of the second bump layer 21b with the tip end of the capillary 16 so as to have a smaller cross section that the cross section of the wire 12, and the wire 12 is cut. When the wire 12 is cut, the wire cut surface 28 is formed. The wire cut surface 28 slightly protrudes upward from the upper surface of the slope wedge 22.

Figure 9:
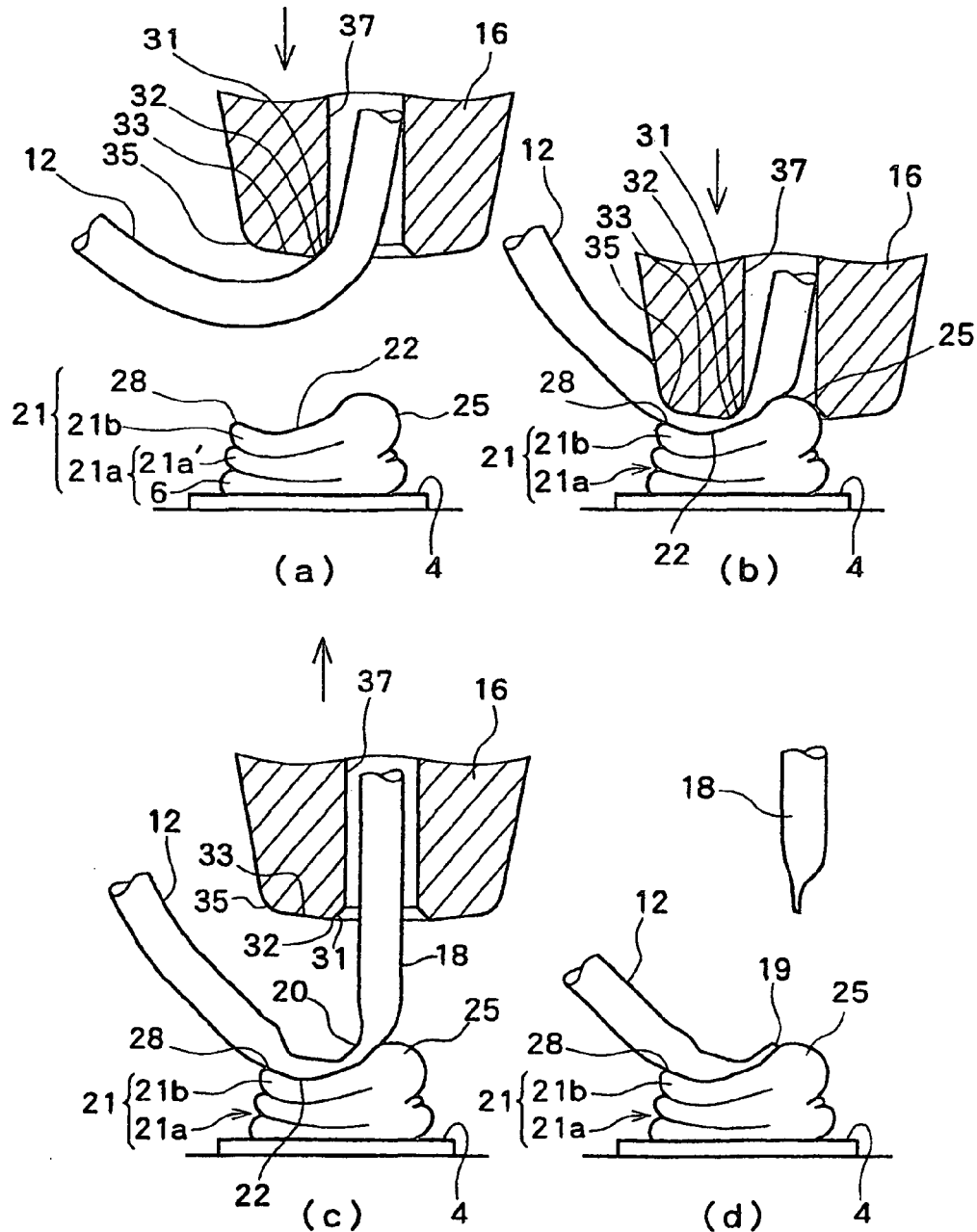
FIG. 9 is an illustrative view showing the steps of bonding the wire to the bump on the semiconductor chip the semiconductor device according to the different embodiment of the present invention.

Referring to FIG. 9, the bonding of the wire 12 to the bump 21 according to this embodiment is described. Like components previously described referring to FIG. 6 are indicated by the like numerals, and an explanation for these components is omitted. The bump 21 according to this embodiment is such that the wire cut surface 28 is formed on the side of the pad 3 to which the wire 12 is looped. The wire cut surface 28 is not hardened because the wire 12 is not formed by bending. Consequently, the strength of supporting the wire 12 is lower than the strength in the example of the previous embodiment. However, according to this embodiment, the bump 21 is formed on the lead 4 that is at a position lower than the position of the pad 3 of the semiconductor chip 2 as shown in FIG. 7, the side of the pad 3 or the first bonding point of the wire 12 that is looped is pulled upward as shown in FIG. 9. Accordingly, the wire cut surface 28 that is not hardened can support the wire 12 and the wire 12 is not brought into contact with the lead 4 by deforming downward. It is the same as the previously described embodiment that the contact area for bonding the wire 12 between the sloped wedge 22 and the wire 12 is large, that the bonding is performed with the center position of the straight hole 37 of the capillary 16 aligned with the center position of the hardened first bent wire convex portion 25, that the wire bent portion 20 having a cross section smaller than the cross section of the wire 12 is formed, and that the wire 12 is cut at the wire bent portion 20.

The semiconductor device 14 according to this embodiment as described above is, similarly to the previous embodiment provides an advantageous effect that it is possible to improve the bondability between the wire 12 and the bump 21, as well as the cutting property of the wire 12, thereby improving the bonding quality. Further, this embodiment provides an advantageous effect that the bump formation can be performed in a short period of time to thereby reduce the bonding time, because the required number of stacks or layers of the bump 21 is only two.

In the above described embodiment, an example is explained in which the bump 21 is formed on the lead 4 as the second bonding point that is lower than the first bonding point. However, the bump 21 can be formed on the pad 3 of the semiconductor chip 2 instead of forming on the lead 4, as long as the bump 21 is formed at the second bonding point that is lower than the first bonding point.

Third Embodiment

The following describes yet another embodiment according to the present invention, referring to the drawings. Like components as used in the previously described embodiments referring to FIG. 2 to FIG. 6 are indicated by the like numerals, and an explanation for these components is omitted. This embodiment relates to a wire bonding method using the capillary 16 having a thinner tip end than the capillary 16 of the previous embodiment, and to a semiconductor device manufactured using this method. Although using the capillary 16 having a thinner tip end in order to adopt the recent trend of fine pitched semiconductor devices becomes more common, in the embodiment described with reference to FIG. 2 to FIG. 6, using the capillary 16 with a thinner tip end can make the second bent wire convex portion 27 independent and semispherical that cannot support the looping wire. According to this embodiment in some cases, even when the wire bonding is performed using the capillary 16 with a thin tip end, the looping wire can be effectively supported and the bondability between the wire 12 and the bump 21 can be improved.

Figure 10:
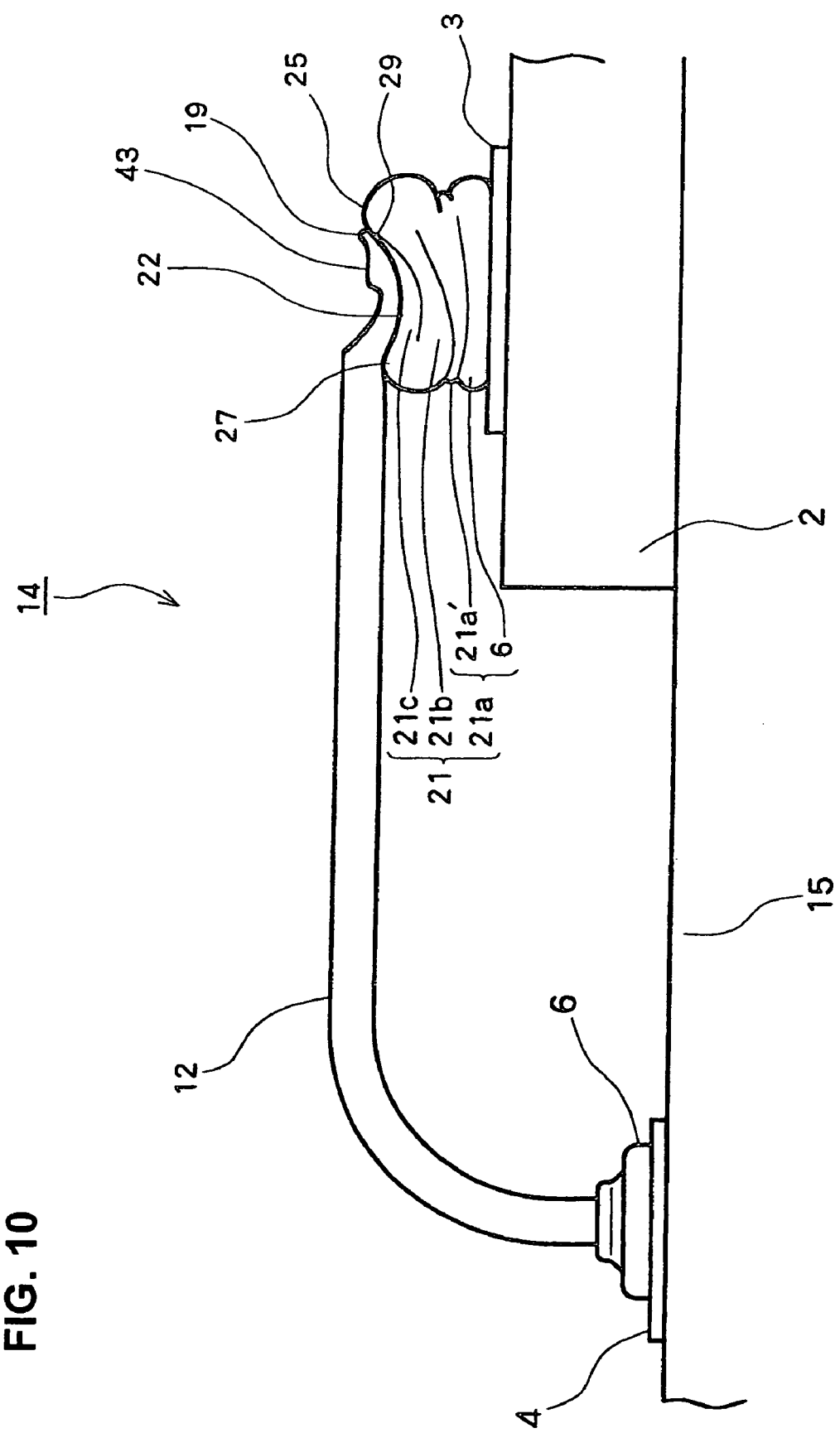
FIG. 10 is a side view showing a connection wire and a bump between a lead frame and a semiconductor chip of a semiconductor device according to a different embodiment of the present invention.

As shown in FIG. 10, the bump 21 formed on the pad 3 is configured such that the wire 12 is folded and stacked or layered on the pad 3, and includes, from a surface of the pad 3, a first bump layer 21a comprised of the pressure-bonded ball 6 and a the bump wire 21a' that is pressed to the pressure-bonded ball 6, a first bent wire convex portion 25 formed on an opposite side from the lead 4, a second bump layer 21b formed by pressing the wire 12 over the first bump layer 21a, a second bent wire convex portion 27 formed on a side of the lead 4, a third bump layer 21c formed by pressing the wire 12 over the second bump layer 21b, a sloped wedge 22 on a upper surface of the bump 21, and a wire cut surface 29 that is a tensile cut surface formed by cutting the wire 12 pulled in the length direction when the wire 12 is folded to form the bump 21. The wire 12 is looped toward the bump 21 after the pressure-bonded ball 6 is formed on the lead 4 as a first bonding point by primary bonding, and then bonded to the sloped wedge 22 on the upper surface of the bump 21 formed on the pad 3 as a second bonding point. The wire 12 has a wire shear cut surface 43 and a wire cut surface 19 on a side of the first bent wire convex portion 25 formed on a side opposite from the lead 4 of the bump 21. The wire shear cut surface 43 is a shear cut surface formed by cutting by a shear force in a direction of a diameter of the wire 12. The wire cut surface 19 is a tensile cut surface formed by cutting while pulling the wire 12 in the length direction. The wire shear cut surface 43 is substantially parallel to a plane including the pad 3 of the semiconductor device 14.

The upper surface of the bump 21 has a concave portion at a middle of the upper surface, and the first and second bent wire convex portions 25 and 27 respectively on both sides of the bump 21 along a connecting direction of the wire 12 protrude upward. The sloped wedge 22 is a sloped flat surface formed from the concave portion at the middle toward the second bent wire convex portion 27 on the side of the lead 4 as the first bonding point. As described above, the sloped wedge 22 is such that the height of the slope is high on the side of the lead 4 as the first bonding point, and then reduces its height from the first bonding point toward the pad 3 as the second bonding point. The wire 12 is bonded along a surface of the sloped wedge 22.

A wire cut surface 29 in bump formation and the wire cut surface 19 in wire bonding are positioned along the first bent wire convex portion 25. Further, the wire shear cut surface 43 is positioned adjacent to the wire cut surface 19.

Figure 11:
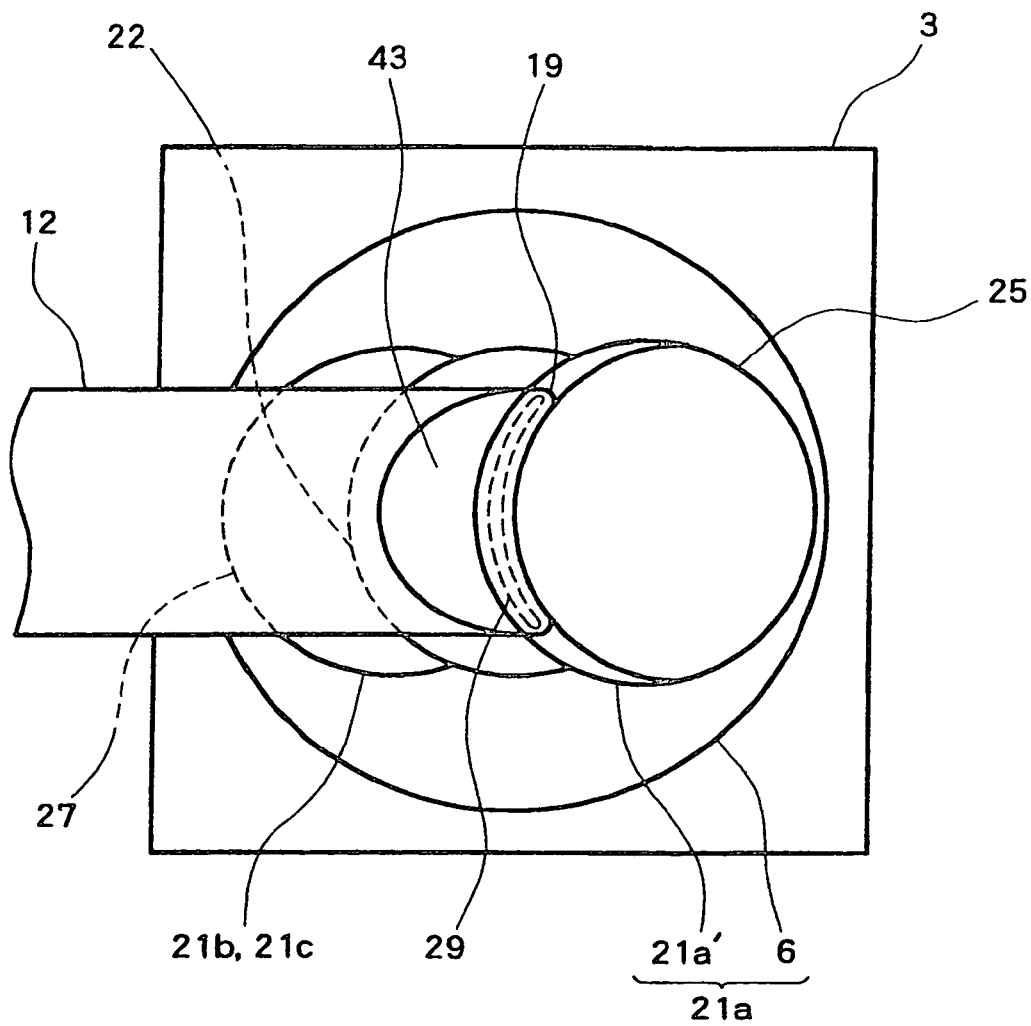
FIG. 11 is a plan view showing the bump and the connection wire formed on the semiconductor device according to the different embodiment of the present invention.

As shown in FIG. 11, the first bent wire convex portion 25 of the bump 21 extends toward an opposite side of the lead 4 as the first bonding point, and the second bent wire convex portion 27 extends toward the lead 4 as the first bonding point. The first bent wire convex portion 25 is substantially a semi-spherical protrusion extending toward the upper surface of the bump 21, the second bent wire convex portion 27 is a partially spherical protrusion whose portion on the side of the lead 4 as the first bonding point extends toward the upper surface of the bump 21 and whose portion on the opposite side is a sloped surface of the sloped wedge 22.

Each of the wire cut surfaces 19 and 29 has a bow-shaped cut surface. The wire cut surface 29 of the wire 12 formed in bump formation can be positioned between the wire cut surface 19 of the wire 12 formed in wire bonding and the first bent wire convex portion, or can be positioned below the wire cut surface 19 and between the wire cut surface 19 and a second bump layer 21b. Further, because the wire shear cut surface 43 is a surface formed by shearing a portion of the wire 12 in the diameter direction from the side of the lead 4 toward the pad 3, the wire shear cut surface 43 takes a bow shape bending toward the side of the lead 4 and continues to the wire cut surface 19.

Referring to FIGS. 12A and 12B, a step for forming the bump 21 on the pad 3 of the semiconductor chip 2 of the semiconductor device 14 according to this embodiment is described. According to a step similar to the formation step of forming the bump 21 from (a) and (b) in FIG. 4A described in the previous embodiment, the pressure-bonded ball 6 and the bump wire 21a' formed into a flattened shape by being pressed onto the pressure-bonded ball 6. The first bump layer 21a is formed by the pressure-bonded ball 6 and the bump wire 21a'. In addition, according to a step similar to the formation step of forming the bump 21 from (c) and (d) in FIG. 4A, the first bent wire convex portion 25 and the second bump layer 21b that is pressure bonded to the first bump layer 21a are formed.

As shown in (a) in FIG. 12A, after forming the second bump layer 21c and the first bent wire convex portion 25, the capillary 16 moves upward and then toward the opposite side from the lead 4. By this transverse movement of the capillary 16, the wire 12 is bent from the side of the lead 4 toward the opposite side of the lead 4 to form the second bent wire convex portion 27. Then, the capillary 16 moves toward a position at which, an end surface of the outer radius portion 35 of the capillary 16 on the side of the lead 4 reaches substantially at a center position of the second bent wire convex portion 27. At this position, the center position of the straight hole 37 of the capillary 16 is displaced from the center position of the first bent wire convex portion 25 toward the side of the lead 4.

As shown in (b) in FIG. 12A, after this transverse movement of the capillary 16, the capillary 16 presses the wire 12 between the face portion 33 and the second bump layer 21b toward the pad 3 using the outer radius portion 35 and the subsequent face portion 33 on the side of the lead 4. The wire 12 is then pressed onto the second bump layer 21b to be flattened and pressure bonded to the second bump layer 21b to form a third bump layer 21c. The end surface of the outer radius portion 35 of the capillary 16 on the side of the lead 4 moves downward at the substantial center position of the second bent wire convex portion 27, and therefore, the end surface of the outer radius portion 35 and the subsequent face portion 33 press a half of the protrusion on the opposite side of the lead 4 from the center of the second bent wire convex portion 27 toward the pad 3. By this, a portion of the second bent wire convex portion 27 that is on the opposite side of the lead 4 is formed into a shape following the end surface of the outer radius portion 35 and the subsequent face portion 33, a curved surface curving from the substantial center position of the second bent wire convex portion 27 toward the opposite side of the lead 4 and a sloped flat surface that continues from the curved surface and declines toward the opposite side of the lead 4 are formed. These curved surface and flat surface form the sloped wedge 22. In addition, a half of the second bent wire convex portion 27 from its center on the side of the lead 4 is not pressed onto the pad 3 by the outer radius portion 35 and the face portion 33, and therefore forms a partially spherical shape. Further, the second bent wire convex portion 27 is bent substantially by 180 degrees by the formation of the third bump layer 21c by the downward movement of the capillary 16. Accordingly, the second bent wire convex portion 27 has a higher degree of hardness than other portions due to work hardening by bending. In this manner, the end surface of the outer radius portion 35 of the capillary 16 and the subsequent face portion 33 presses a half of the protrusion of the second bent wire convex portion 27 on the opposite side of the lead 4 onto the pad 3, even when the tip end of the capillary 16 is thin, the second bent wire convex portion 27 does not form an independent and semi-spherical protrusion, and can be formed into a partially spherical shape on the side of the lead 4 and the sloped wedge 22 that continues therefrom.

As shown in (c) in FIG. 12A, when the third bump layer 21c, the second bent wire convex portion 27, and the sloped wedge 22 are formed by the downward movement of the capillary 16, the capillary 16 moves upward from a height of the upper surface of the sloped wedge 22 to a height at which a position where a height of the tip end of the capillary 16 is lower than a height of the upper end of the first bent wire convex portion 25.

As shown in (d) in FIG. 12A, after moving upward, the capillary 16 moves substantially in parallel to the pad 3 to the opposite side from the lead 4. The continuous portion between the wire 12 inserted through the capillary 16 and the third bump layer 21c is pressed onto the surface of the first bent wire convex portion 25 on the side of the lead 4 with the straight hole 37 and the inner chamfer 31 of the capillary 16. Because the first bent wire convex portion 25 has a higher degree of hardness than other portions due to the work hardening by bending in the previous step, the wire 12 that is held between the straight hole 37 and the inner chamfer 31 of the capillary 16 made of the hard material can be deformed. Then, when the capillary 16 further moves transversely to the opposite side of the lead 4, the corner 32 of the inner chamfer 31 the capillary 16 bites into the wire 12, and the wire 12 starts to be sheared off in the diameter direction by an edge of the corner 32. A terrace-shaped wire shear cut surface 41 whose upper surface is substantially horizontal is formed by this shearing. At the same time, the inner chamfer 31 compresses the wire 12 between the first bent wire convex portion 25, and the wire bent portion 30 having a bow-shaped cross section in which the cross section of the continuous portion of the wire 12 is smaller than the cross section of the wire 12.

As shown in (c) in FIG. 13, the wire 12 is formed by compression by being sandwiched by the circularly tapered inner chamfer 31 and the semi-spherical first bent wire convex portion 25, and the bow-shaped wire bent portion 30 that follows the outer surface of the first bent wire convex portion 25 is formed. The wire bent portion 30 is at the first bent wire convex portion 25 on the side of the lead 4. Further, the wire shear cut surface 41 is positioned at the wire bent portion 30 on the side of the lead 4 that has been formed by shearing a portion of the wire 12 in the diameter direction. The wire shear cut surface 41 is a bow-shaped flat surface having a protrusion towards the side of the lead 4. The upper surface of the wire shear cut surface 41 is substantially parallel to the pad 3, and has a terrace shaped rising from the slope wedge 22. Then, as shown in (a) in FIG. 13, the wire 12 after the formation is sloped toward the opposite side from the lead 4 by a clearance between the straight hole 37 of the capillary 16 and the wire 12 so as to extend upward by being guided through the straight hole 37.

As shown in (e) in FIG. 12B, once the shearing of a portion of the wire 12 and the formation of the wire bent portion 30 are completed, the capillary 16 moves up. At this time, the clamper that is not shown is open, the tail wire 18 is lead out below the capillary 16 by the upward movement of the capillary 16.

As shown in (f) in FIG. 12B, when the capillary 16 reaches the height at which the length of the tail wire 18 is sufficient enough to form a subsequent ball, the clamper that is not shown is closed and moves up while holding the wire 12 along with the capillary 16. Then the wire 12 is pulled upward by the clamper and applied with a tensile force. Because a cross section of the wire bent portion 30 is smaller than a cross section of the wire 12 is formed, a large tensile stress is generated at the wire bent portion 30 due to the tensile force applied to the wire 12. Then, the wire 12 is tensile cut at the wire bent portion 30 by the tensile stress to form the wire cut surface 29. Because the area of the wire bent portion 30 is made small, a total tension applied to the wire 12 in tensile cutting the wire 12 can be small, and it is possible to suppress an occurrence of a bend in the wire 12 by a reaction of the tensile force when the wire 12 is tensile cut. Once the wire 12 is tensile cut, the step of forming the bump 21 that has the first bent wire convex portion 25 and the sloped wedge 22 and that is stacked or layered multiple times is completed.

Figure 14B:
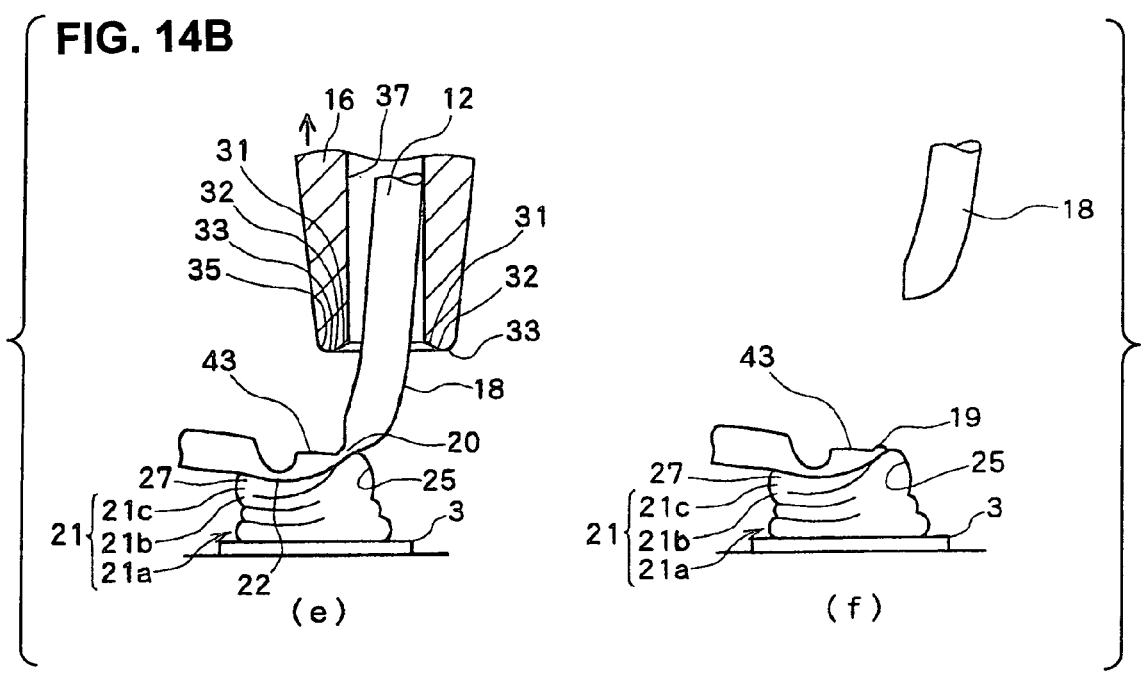
Figure 16:
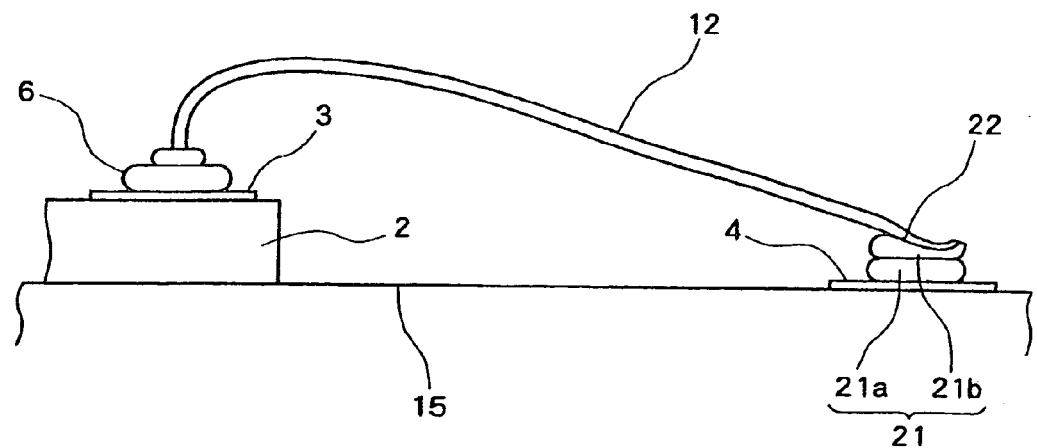
FIG. 16 is an illustrative view showing a bonding step of a wire of the semiconductor device according to the conventional art.
Figure 17:
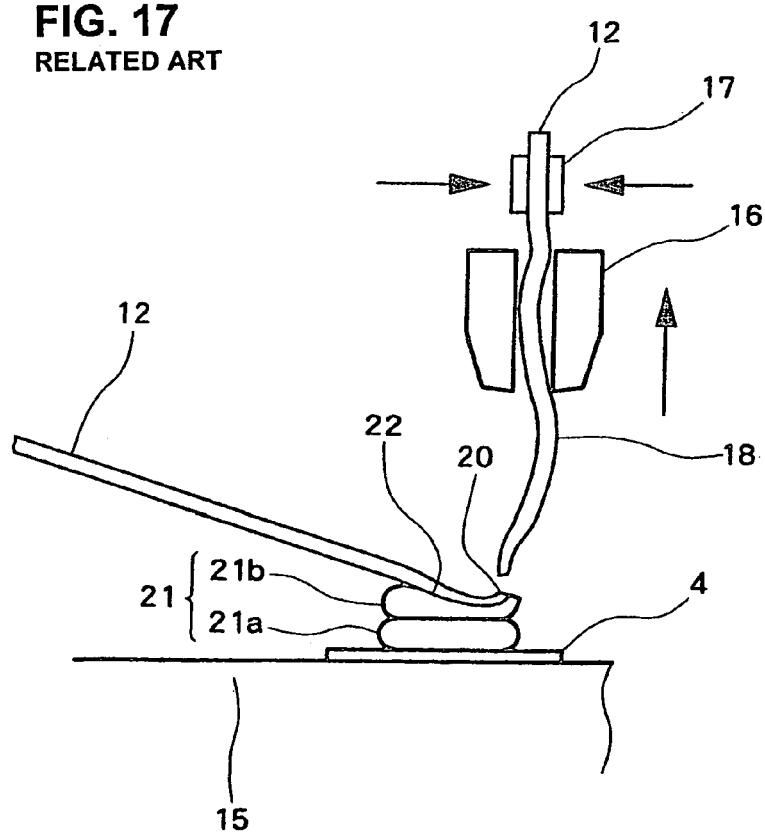
FIG. 17 is an illustrative view showing cutting of the wire of the semiconductor device according to the conventional art.
Figure 18:
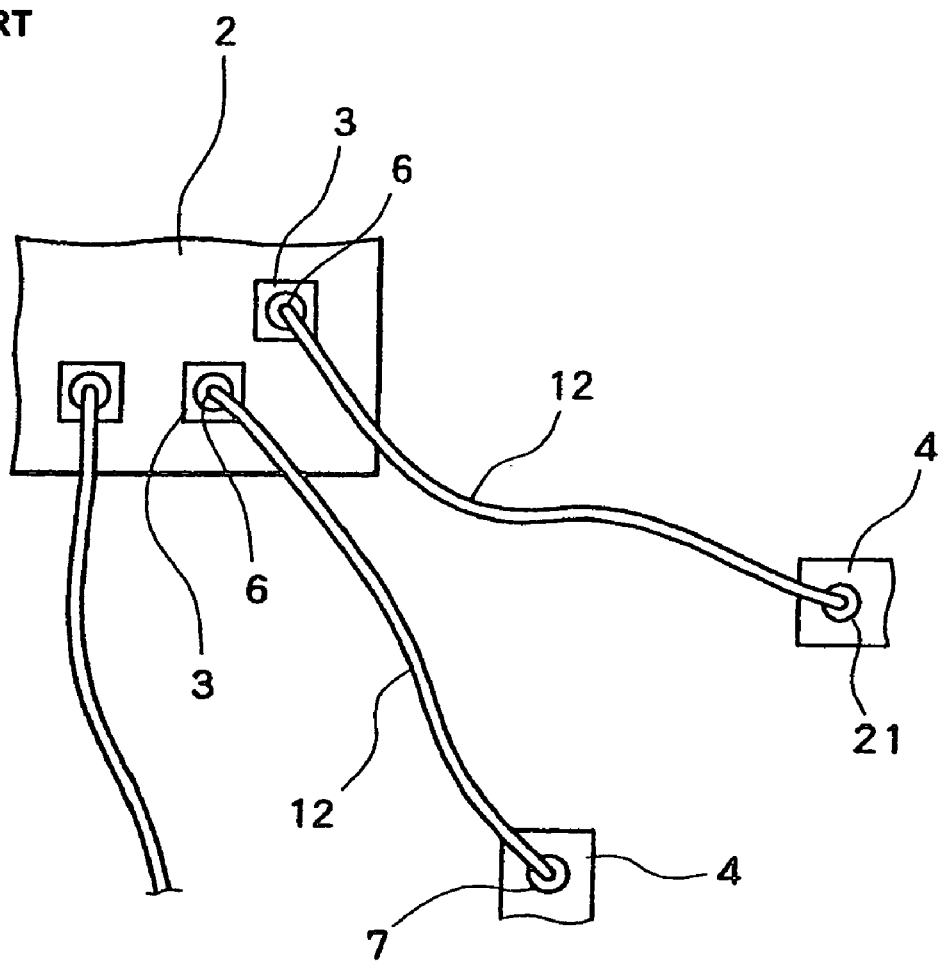
FIG. 18 is an illustrative view showing deformation of the wire by bending of the semiconductor device according to the conventional art.

Referring to FIGS. 14A and 14B, a step of bonding the wire 12 onto the bump 21 formed on the pad 3 of the semiconductor chip 2 of the semiconductor device 14 according to this embodiment is explained.

As shown in (a) in FIG. 14A, after first bonding to the lead 4 as the first bonding point, the wire is looped and the capillary 16 is moved so that the end surface of the outer radius portion 35 of the capillary 16 through which the wire 12 is inserted on the side of the lead 4 is positioned at the end portion of the sloped wedge 22 formed on the upper surface of the bump 21 on the side of the lead 4, and then the bonding step is started. Then, when the end surface of the outer radius portion 35 of the capillary 16 on the side of the lead 4 comes to lead side end portion of the sloped wedge 22 formed on the upper surface of the bump, the capillary 16 is moved downward.

As shown in (b) in FIG. 14A, the capillary moves downward so that the end surface of the outer radius portion 35 of the capillary 16 on the side of the lead 4 and the subsequent face portion 33 follow the plane of the sloped wedge 22, and presses the wire 12 between the face portion 33 and the sloped wedge 22 onto the sloped wedge 22 using the face portion 33 on the side of the lead 4. The second bent wire convex portion 27 is formed partially spherical on the side of the lead 4 of the bump 21 to which the wire 12 is looped and hardened by the bending, the side of the lead 4 of the wire 12 pressed downward by the face portion 33 of the capillary 16 is supported by the second bent wire convex portion 27. Then, when the capillary 16 moves further downward, the wire 12 between the face portion 33 and the sloped wedge 22 is deformed into a shape following the slope wedge 22. Then, when the capillary 16 moves further downward, the upper surface of the wire 12 is formed into a shape following the shapes of the face portion 33 of the capillary 16 and the outer radius portion 35, and a lower surface of the wire 12 is pressed onto the sloped wedge 22 to be deformed into a shape following the surface of the slope wedged 22, and the lower surface of the wire 12 is bonded to the bump 21. At this time, the wire 12 is also pressed onto the terrace-shaped wire shear cut surface 41 that is formed in the formation of the bump 21, and the wire shear cut surface 41 is collapsed and bonded with the wire 12. Because the surface of the sloped wedge 22, the wire shear cut surface 41, and the wire 12 have a large bonding area, the bondability between the wire 12 and the bump 21 is improved.

The wire 12 that extends toward the side of the lead 4 is supported by the hardened second bent wire convex portion 27, and accordingly, does not deform downward toward the surface of the pad 3 even when the wire 12 is pressed down by the face portion 33 and the outer radius portion 35 of the capillary 16. Therefore, it is possible to prevent the wire 12 from being brought into contact with the lead 4 or the semiconductor chip 2.

As shown in (c) in FIG. 14A, when the bonding of the wire 12 to the bump 21 is completed by the downward movement of the capillary 16, the bonding step ends, and a bent portion forming step is started. The capillary 16 moves upward from a height of the upper surface of the sloped wedge 22 to a height where a height of the tip end of the capillary 16 is lower than a height of the upper end of the first bent wire convex portion 25.

As shown in (d) in FIG. 14A, after moving upward, the capillary 16 moves substantially in parallel to the pad 3 to the opposite side from the lead 4. Similarly to the formation of the bump 21 as described with reference to FIGS. 12A and 12B, when the capillary 16 further moves transversely to the opposite side of the lead 4, the corner 32 of the inner chamfer 31 the capillary 16 bites into the wire 12, and the wire 12 starts to be sheared in the diameter direction by an edge of the corner 32. A terrace-shaped wire shear cut surface 41 whose upper surface is substantially horizontal is formed by this shearing. At the same time, the inner chamfer 31 compresses the wire 12 between the first bent wire convex portion 25, and the wire bent portion 20 having a bow-shaped cross section in which the cross section of the continuous portion of the wire 12 is smaller than the cross section of the wire 12. Once the wire bent portion 20 is formed, the bent portion forming step is completed.

As shown in (b) and (c) in FIG. 13, the shape and the cross section of the wire bent portion 20 are bow-shaped following the outer surface of the first bent wire convex portion 25 similarly to the wire bent portion 30 as previously described referring to (a) and (c) in FIG. 13, and positioned on the side of the lead 4 of the first bent wire convex portion 25. Further, similarly to the wire shear cut surface 41, the wire shear cut surface 43 is positioned at the wire bent portion 30 on the side of the lead 4, and is a bow-shaped flat surface having a protrusion towards the side of the lead 4. The upper surface of the wire shear cut surface 41 is substantially parallel to the pad 3, and has a terrace shape rising from the sloped wedge 22.

As shown in (e) in FIG. 12B, once the shearing of a portion of the wire 12 and the formation of the wire bent portion 20 are completed, the capillary 16 moves up to start the wire cutting step. At this time, the clamper that is not shown is open, the tail wire 18 is lead out below the capillary 16 by the upward movement of the capillary 16.

As shown in (f) in FIG. 12B, when the capillary 16 reaches the height at which the length of the tail wire 18 is sufficient enough to form a subsequent ball, the clamper that is not shown is closed and moves up while holding the wire 12 along with the capillary 16. Then the wire 12 is pulled upward by the clamper and applied with a tensile force. Because a cross section of the wire bent portion 30 is smaller than a cross section of the wire 12 is formed, a large tensile stress is generated at the wire bent portion 30 due to the tensile force applied to the wire 12. Then, the wire 12 is tensile cut at the wire bent portion 30 by the tensile stress to form the wire cut surface 29. Because the area of the wire bent portion 30 is made small, a total tension applied to the wire 12 in tensile cutting the wire 12 is small, and it is possible to suppress an occurrence of a bend in the wire 12 by a reaction of the tensile force when the wire 12 is tensile cut. Once the wire 12 is tensile cut, the wire cut surface 19 having a bow shape following the shape of the side surface of the first bent wire convex portion 25 on the side of the lead 4 is formed. Once the wire 12 is cut, the wire cutting step is completed, and the wire bonding ends.

The semiconductor device 14 according to this embodiment as described above is, similarly to the previous embodiment provides an advantageous effect that it is possible to improve the bondability between the wire 12 and the bump 21, as well as the cutting property of the wire 12, thereby improving the bonding quality. Further, this embodiment provides an advantageous effect that the bondability between the wire 12 and the bump 21 can be improved by effectively supporting the looping wire even when the bump formation and the wire bonding is performed using a capillary 16 having a thin tip end.

In the above described embodiment, an example is explained in which the bump 21 is formed on the pad 3 of the semiconductor chip 2 as the second bonding point that is higher than the lead 4 of the lead frame 15 as the first bonding point. However, the bump 21 can be formed at a position higher or lower than the first bonding point, or can be formed on the lead 4 of the lead frame 15 instead of forming on the pad 3.

What is claimed is:

1. A semiconductor device for connecting between a first bonding point and a second bonding point using a wire, the device comprising:
   a bump that is formed by folding the wire to be stacked on the second bonding point, the bump including a bent wire convex portion on an opposite side from the first bonding point; and
   the wire that extends from a side of the first bonding point toward the bump and is bonded on an upper surface of the bump, the wire having a cut surface smaller than a cross-section of the wire on a side of the bent wire convex portion.

2. A semiconductor device for connecting between a first bonding point and a second bonding point using a wire, the device comprising:
   a bump that is formed by folding the wire to be stacked on the second bonding point, the bump including bent wire convex portions on a side of the first bonding point and an opposite side from the first bonding point; and
   the wire that extends from a side of the first bonding point toward the bump and is bonded on an upper surface of the bump, the wire having a cut surface smaller than a cross-section of the wire on a side of the bent wire convex portion that is on the opposite side from the first bonding point.

3. The semiconductor device according to claim 1, wherein the bump is provided with a sloped wedge formed by folding the wire to be stacked on the second bonding point and having a sloped surface on the upper surface of the bump, and
   the wire is bonded to the upper surface of the bump along the sloped wedge.

4. The semiconductor device according to claim 2, wherein the bump is provided with a sloped wedge formed by folding the wire to be stacked on the second bonding point and having a sloped surface on the upper surface of the bump, and
   the wire is bonded to the upper surface of the bump along the sloped wedge.

5. The semiconductor device according to claim 2, wherein the bump is provided with a sloped wedge formed by folding the wire to be stacked on the second bonding point and having a sloped surface whose height decreases from the first bonding point toward the second bonding point, and
   the wire is bonded to the upper surface of the bump along the sloped wedge.

6. The semiconductor device according to claim 1, wherein the cut surface has a bow-shaped cross section.

7. The semiconductor device according to claim 2, wherein the cut surface has a bow-shaped cross section.

8. A semiconductor device for connecting between a first bonding point and a second bonding point using a wire, the device comprising:
   a bump that is formed by folding the wire to be stacked on the second bonding point, the bump including a bent wire convex portion on an opposite side from the first bonding point; and
   the wire that extends from a side of the first bonding point toward the bump and is bonded on an upper surface of the bump, the wire having a tensile cut surface smaller than a shear cut surface and a cross-section of the wire on a side of the bent wire convex portion.

9. A semiconductor device for connecting between a first bonding point and a second bonding point using a wire, the device comprising:
   a bump that is formed by folding the wire to be stacked on the second bonding point, the bump including bent wire convex portions on a side of the first bonding point and an opposite side from the first bonding point; and
   the wire that extends from a side of the first bonding point toward the bump and is bonded on an upper surface of the bump, the wire having a tensile cut surface smaller than a shear cut surface and a cross-section of the wire on a side of the bent wire convex portion that is on the opposite side from the first bonding point.

10. The semiconductor device according to claim 8, wherein
- the bump includes a sloped wedge provided on an upper surface of the bump and on the side of the first bonding point, and having a sloped surface whose height decreases from the first bonding point toward the second bonding point, and
- the wire is bonded to the upper surface of the bump along the sloped wedge.

11. The semiconductor device according to claim 9, wherein
- the bump includes a sloped wedge provided on an upper surface of the bump and on the side of the first bonding point, and having a sloped surface whose height decreases from the first bonding point toward the second bonding point, and
- the wire is bonded to the upper surface of the bump along the sloped wedge.

12. The semiconductor device according to claim 9, wherein
- the bump includes a sloped wedge provided on an upper surface of the bum so as to be adjacent to the bent wire convex portion on the side of the first bonding point, and having a sloped surface whose height decreases from the first bonding point toward the second bonding point, and
- the wire is bonded to the upper surface of the bump along the sloped wedge.

13. The semiconductor device according to claim 8, wherein
- the shear cut surface is substantially parallel with a surface of the semiconductor device including the second bonding point, and
- the tensile cut surface has a bow-shaped cross section.

14. The semiconductor device according to claim 9, wherein
- the shear cut surface is substantially parallel with a surface of the semiconductor device including the second bonding point, and
- the tensile cut surface has a bow-shaped cross section.

15. The semiconductor device according to claim 1, wherein the wire is made from gold and said second bonding point is a material which has poor bondability to gold.

* * * * *